United States Patent
Satoh

(10) Patent No.: US 7,218,559 B2
(45) Date of Patent: May 15, 2007

(54) MEMORY DEVICE HAVING REDUNDANT MEMORY FOR REPAIRING DEFECTS

(75) Inventor: Tomotoshi Satoh, Yamatokoriyama (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 11/227,038

(22) Filed: Sep. 14, 2005

(65) Prior Publication Data

US 2006/0056247 A1 Mar. 16, 2006

(30) Foreign Application Priority Data

Sep. 14, 2004 (JP) ............................. 2004-267341

(51) Int. Cl.
*G11C 29/00* (2006.01)
(52) U.S. Cl. .................. 365/200; 365/230.03; 365/63
(58) Field of Classification Search ................ 365/200, 365/230.03, 63
See application file for complete search history.

(56) References Cited

U.S. PATENT DOCUMENTS 4,807,191 A * 2/1989 Flannagan .................. 714/711
5,796,662 A * 8/1998 Kalter et al. ................. 365/200
6,324,114 B1 * 11/2001 Himeno .................. 365/230.03
6,674,673 B1 1/2004 Hsu et al.
6,674,676 B1 1/2004 Hsu et al.

FOREIGN PATENT DOCUMENTS

| JP | 2004-071104 A | 3/2004 |
| JP | 2004-087100 A | 3/2004 |
| JP | 2004-264057 A | 9/2004 |
| JP | 2005-100517 A | 4/2005 |

* cited by examiner

*Primary Examiner*—Huan Hoang
(74) *Attorney, Agent, or Firm*—Morrison & Foerster LLP

(57) ABSTRACT

First memory chips each have a memory cell as storage means for storing data and do not have a redundant memory cell as redundant storage means for repairing an erroneous bit in the memory cell. Furthermore, a logic minimal in degree is solely provided for operation on a control logic of a second memory chip. The second memory chip has a control logic for effecting memory control of the memory cells, the redundant memory cells, etc. and a redundant memory cell for repairing an error bit of the first memory chips. The memory device is structured by stacking the first and second memory chips.

3 Claims, 21 Drawing Sheets

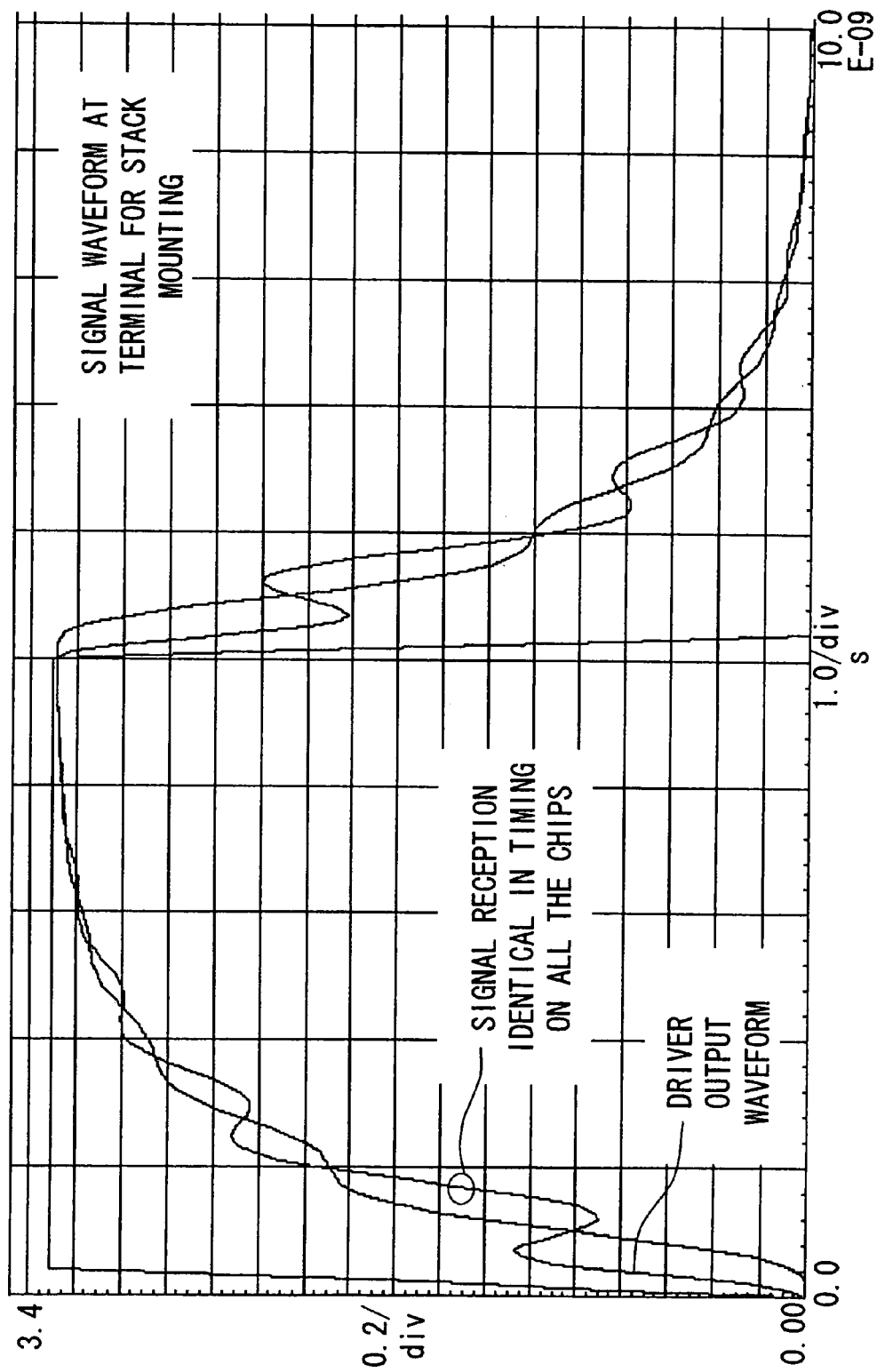

MEMORY DEVICE HAVING REDUNDANT MEMORY FOR REPAIRING DEFECTS

CROSS-REFERENCE TO RELATED APPLICATION

This application claims priority to Japanese Patent Application No. JP 2004-267341, which was filed on Sep. 14, 2004, and the contents of which are incorporated herein by reference, in their entirety.

BACKGROUND OF THE INVENTION

1. Field of the Invention

The present invention relates to a memory device that defects of a memory possessed by a memory chip can be repaired.

2. Description of the Related Art

In the memory chip, erroneous bits possibly occur as defects that disable normal storage operation because of a trouble encountered in the process. In the case there is an erroneous bit even one in the number on a memory chip, the memory chip must be scrapped away as a poor product. This results in a lowering in production yield.

FIG. 21 is a block diagram showing a configuration of a memory chip 80 applied with the related art. The memory chip 80 includes a memory cell 81, a row decoder 82, a column decoder 83, a redundant row memory cell 84, a redundant column memory cell 85, a redundant row decoder 86 and a redundant column decoder 87. The memory cell 81 is a memory cell for storing data. In the memory cell 81, data is to be read or write out of and to the intersections of data and word lines that are two orthogonal signal lines. The circuits for selecting the data line and word line are respectively the column decoder 83 and the row decoder 82. The redundant row memory cell 84 and the redundant column memory cell 85 are to change into a memory cell for replacement in the event of occurrence of a failure, such as a break in the data line and word line.

In case a defective data and word line in a memory cell is found in a test and repair process in the manufacturing process of a memory chip, the corresponding value is stored as a decision value in a fuse storage circuit provided in the redundant column decider 87 and redundant row decoder 86. Furthermore, the column decoder 83 and row decoder 82 corresponding to the data line and word line to be replaced are set not to operate when the corresponding value is designated. In this manner, by replacing the erroneous bits of the memory cell 81 with the redundant row memory cell 84 and redundant column memory cell 85, the defective memory cell is repaired to operate as a good product. From now on, it is referred to as a repair with redundancy to repair an erroneous bit of the memory cell 81 by use of a redundant memory cell, such as a redundant row memory cell 84 and redundant column memory cell 85.

As a typical, first related art as described in relation to FIG. 21, there is a redundant system that the column having an erroneous bit is to be replaced with a redundant memory by using a fuse storage circuit for storing fuse information representative of a column position at which an erroneous bit exists (see Japanese Unexamined Patent Publication JP-A 2004-87100, for example).

In such a related art, the memory chip is mounted with a storage device greater in storage capacity than the memory chip. By replacing the erroneous bit with the storage device in a portion exceeding the storage capacity, the memory chip involving an erroneous bit is operated as a good product.

Erroneous bits take place with statistic disorder, on the memory chip. The erroneous bits distribute on the memory chip, according to a statistic probability. The storage capacity of a redundant memory, required for a repair with redundancy, is determined by a balance between a yield to be improved by a repair with redundancy and a memory chip size to be increased by the redundant memory. Consequently, there arises memory chips not to be repaired with redundancy, i.e. memory chips unavoidably scrapped away as unacceptable products, at a certain probability.

The memory to be read destructively, as represented by the DRAM (dynamic random access memory), requires complicated control, e.g. repairing the data destroyed upon reading by post-read rewrite. There is devised a memory, such as a pseudo SRAM (static random access memory), that control from the external of the memory chip is facilitated by arranging a logic for memory control within the memory chip in place of effecting complicated control from the external of the memory chip.

Even in an electrically erasable memory such as a flash memory, complicated control is needed including to supply, as a write operation voltage, a voltage different from the reading operation voltage, and allow operation while monitoring a write completion, and so on. The flash memory, in many kinds, is mounted with a logic for memory control within the memory chip so that control from the external of the memory chip can be made easily.

There is a semiconductor storage device allowing a flash memory to operate at high speed, as a second related art related to the logic for memory control. The semiconductor storage device has, therein, a logic for memory control, a flash memory and a plurality of working RAMs. The logic for memory control is to operate the flash memory at high speed by interleave operation through taking the plurality of working RAMs in synchronism with a clock (see Japanese Unexamined Patent Publication JP-A 2004-71104, for example).

The memory device used in a computer is rarely composed of only one memory chip. In many cases, it is composed of a plurality of memory chips in the same kind. There is developed and commercially applied a complex memory package including a plurality of memory chips within one package, owing to the progress in highly-integrated package technology. In the case of a memory device using a plurality of memory chips and mounted with a pseudo SRAM or a flash memory, there is no need to provide a logic for memory control on each memory chip from a circuit perspective of view. It is sufficient to provide one per memory device.

Because such a memory cell as a pseudo SRAM or a flash memory requires complicated control as noted above, many electric interconnections are needed between the logic for memory control and the memory cells. In case the logic for memory control and the memory cells are mounted on separate memory chips, there is an increased number of terminals required to connect between the memory chips. For this reason, the terminals increased in the number are not easily accommodated in the conventional semiconductor package. Thus, it is not easy to adopt mounting the logic for memory control and those memory cells on different memory chips.

Furthermore, it is frequent to arrange a memory chip in a planar form on a circuit board. It takes a time in signal propagation correspondingly to the planar size of the memory chip, causing a time difference in the time to receive signals at the individual memory chips. Considering the time difference in signal delay, realization is easy by arranging the conventionally used logic on each memory chip rather than employing a logic for complicated control. Namely, because each memory chip is mounted with a logic for memory control, it is possible to avoid the increase in the number of terminals and logic complexity though the logic is provided redundantly. Accordingly, it is a practice to configure a memory device by using a plurality of memory chips each mounted with a logic for memory control without collectively using a logic for memory control.

However, in the first related art, there is a relationship in balance between the yield and the memory chip size increased by the redundant memories. Namely, there is restriction that, in case the redundant memories are increased in the number in order to improve the yield, the chip size increases. Thus, there is a problem that the chips cannot be reduced down to a size required to secure a constant value or higher of yield.

Furthermore, error bits are practically repaired on a memory-chip unit basis. There is a problem that, even where there are available redundant memories of other memory chips, the memory chip is to become poor unless repaired by the redundant memory of the relevant memory chip.

In the second related art, a logic for memory control is mounted within the memory chip, thus realizing the increase of speed. However, there is a problem that the memory chip increases in size because the memory, the memory controlling logic and the redundant memory are mounted on the memory chip.

SUMMARY OF THE INVENTION

An object of the invention is to provide a memory device that defective points of another memory chip can be repaired by means of a control logic simple and high in speed and wherein the memory chip thereof can be reduced in size.

The invention provides a memory device, comprising a plurality of memory mounting members each having at least one of storage means for storing data and redundant storage means for storing data to be stored to a defective point of the storage means, the plurality of memory mounting members being stacked in a direction of thickness thereof, wherein, when a memory space of the defective point of the storage means is not to be allocated to redundant storage means of the mounting means having storage means having the defective point, the memory space of the defective point is allocated to redundant storage means of another of memory storage means.

According to the invention, the memory device is configured by stacking a plurality of memory mounting members in a direction of thickness thereof. Each of the memory mounting member has at least one of storage means for storing data and redundant storage means for storing data to be stored in a defective point of the storage means. When a memory space of the defective point of the storage means is not to be allocated to redundant storage means of the mounting means having storage means having the defective point, the memory space of the defective point is allocated to redundant storage means of another of memory storage means.

In this manner, the defective point in the storage means is repaired by the redundant storage means of another of mounting means. Furthermore, by stacking the memory mounting members, time difference in signal propagation is extremely reduced, thereby eliminating the necessity of a control logic that takes account of a time difference. Accordingly, it is possible to realize a control logic simple and high in speed and to repair a defective point in the memory chip that is another of memory mounting members.

According to the invention, because the defect point in the storage means is repaired by the redundant storage means of the first or second memory chip other than the memory chip as the memory mounting member of the storage means having the defect, memory chip yield can be improved. Furthermore, because time difference in signal propagation is made extremely small by stacking the first memory chips and the second memory chip three-dimensionally in a direction of thickness thereof, there is eliminated the need for a control logic that takes account of a time difference, thus making it possible to realize a control logic simple and high in speed.

In the invention, it is preferable that the plurality of memory mounting members comprises a first memory mounting member having the storage means but not having the redundant storage means, and a second memory mounting member having the redundant storage means but not having the storage means, the second memory mounting member further has control means for allocating the memory space of the defective point of the storage means included in the first memory mounting member to redundant storage means of the second memory mounting member, and controls data write and read to and from the storage means of the first mounting means and the redundant storage means of the second memory mounting member, the plurality of memory mounting members are composed of one or a plurality of the first memory mounting member and one of the second memory mounting member.

According to the invention, the first memory mounting member has solely storage means to thereby eliminate the redundant means. The redundant storage means and control means are mounted only on one second memory mounting member. Accordingly, the memory chip can be further reduced in size.

Further, according to the invention, the memory device is composed of first memory chips having solely storage means for storing data, and a second memory chip having control means for memory control and redundant storage means for repairing a defect in the storage means of the first memory chip. Accordingly, there is no need to mount the control means and the redundant storage means on each of the memory chips, thus making it possible to further reduce the size of the memory chips.

Furthermore, in the invention, it is preferable that the first memory mounting member has identification number storage means for storing an identification number for identifying the first memory mounting member, the control means allocates a memory space specified based on the identification number to the storage means of the first memory mounting member storing a corresponding identification number in the identification number storage means.

According to the invention, the memory chip as the first memory mounting member has the identification number storage means for storing an identification number corresponded to the allocated memory space. Accordingly, it is possible to select a first memory chip allocated with a memory space where data is to be read or written.

Meanwhile, according to the invention, the first memory chip has identification number storage means for storing an identification number corresponded to the allocated memory space. Accordingly, even in case the first memory chips identical in circuit configuration are stacked, it is possible to select the first memory chip assigned with the memory space where data is to be read and written, by use of the identification number storage means.

In the invention, it is preferable that the first memory mounting member has chip selecting means for previously making a setting to select the first memory mounting member, the control means allocates memory sections divided correspondingly to the respective ones of the chip selecting means to the storage means of the first memory mounting member selected by the chip selecting means.

According to the invention, the memory chip as the first memory mounting member has chip selecting means for selecting a first memory chip corresponded to the allocated memory space. Accordingly, it is possible to select a first memory chip allocated with a memory space where data is to be read or written.

Meanwhile, according to the invention, the first memory chip has chip selecting means for selecting the first memory chip corresponded to the allocated memory space. Accordingly, even in case the first memory chips identical in circuit configuration are stacked, it is possible to select the first memory chip assigned with the memory space where data is to be read and written, by use of the chip selecting means.

Furthermore, in the invention, it is preferable that the memory device comprises defect address storage means for storing an address representative of a position of a defect in the storage means included in the first memory mounting member, and comparator means for comparing between an address stored in the defect address storage means and an address where data is to be read and written, the control means reading and writing data from and to a corresponding address of the redundant storage means of the second memory mounting member in place of the storage means of the first memory mounting member when the addresses compared by the comparator means are in agreement.

According to the invention, there are provided defect address storage means for storing an address representative of a position of a defect in the storage means of the memory chip as the first memory mounting member, and comparator means for comparing between an address stored in the defect address storage means and an address where data is to be read and written. Accordingly, when the addresses compared by the comparator means are in agreement, the data to be stored to the defect point in the storage means of the first memory chip can be read and written from and to the redundant storage means of the second memory chip.

Meanwhile, according to the invention, the address representative of a defect position in the storage means can be previously stored so that, when the stored address is designated, the data to be stored to the defect in the storage means of the first memory chip can be read and written from and to the redundant storage means of the second memory chip. Accordingly the defect in the storage means of the first memory chip can be repaired by the redundant storage means of the second memory chip.

BRIEF DESCRIPTION OF THE DRAWINGS

Other and further objects, features, and advantages of the invention will be more explicit from the following detailed description taken with reference to the drawings wherein:

FIGS. 20A and 20B are figures showing a timing to receive a signal by the memory chips different in the form of mounting.

DETAILED DESCRIPTION

Figure 1:
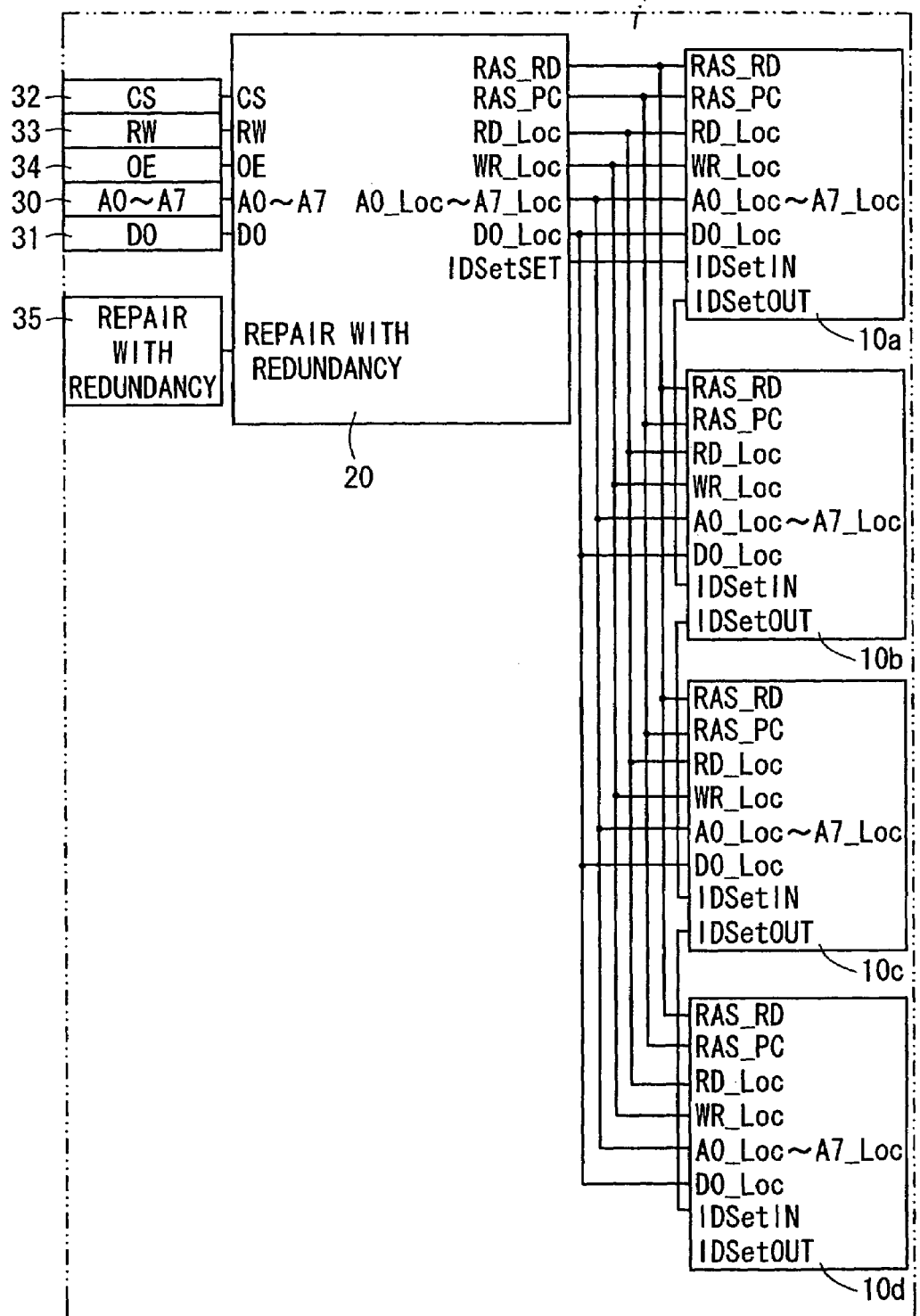
FIG. 1 is a diagram showing a circuit configuration of a memory device in a first embodiment of the invention.

Now referring to the drawings, preferred embodiments of the invention are described below.

FIG. 1 is a diagram showing a circuit configuration of a memory device 1 in a first embodiment of the invention. Storage is explained as a DRAM in scheme. The memory device 1 includes first memory chips 10a, 10b, 10c and 10d (hereinafter, sometimes collectively referred as a first memory chip 10), as a first memory mounting member, and a second memory chip 20, as a second memory mounting member.

The first memory chips 10a to 10d each have a memory cell as storage means for storing data, without having a redundant memory cell as redundant storage means for repairing an erroneous bit as a defect in the memory cell. Furthermore, a logic minimal in degree is solely provided to operate on a control logic as control means in the second memory chip.

The second memory chip 20 has a control logic as a logic for effecting memory control of the memory cells and the redundant memory cells, and a redundant memory cell for repairing an error bit of the first memory chips 10a to 10d. This control logic serves to simplify the complicated operation of the first memory chips 10a to 10d.

The memory device 1 is mounted with four first memory chips each storing 1-bit-based data in an amount of 64 bits for example, to realize a 256-bit storage capacity. Here, 1 bit is assumed 1 word. This invention is not limited to 256 bits of storage capacity and four in the number of the first memory chips, i.e. it is possible to select a storage capacity and the number of the first memory chips freely.

The memory device 1, furthermore, includes an AD0–AD7 terminal 30 for designating an 8-bit address for accessing to a 256-bit capacity, a D0 terminal 31 for inputting or outputting 1-bit data, a CS terminal 32 for selecting the first memory chip, an RW terminal 33 for designating write or read, an OE terminal 34 for permitting an output and a repair-with-redundancy terminal 35 for instructing a repair with redundancy. The repair-with-redundancy terminal 35 may be designated in combination with other terminals, or designated singly for a repair with redundancy by providing a plurality of independent terminals.

The number of signals at between the first memory chips 10a to 10d and the second memory chip 20 is greater than the number of signals to be exchanged with the external of the memory device 1 through the terminals 30 to 35. This is because the control logic on the second memory chip 20 is to take complicated control of the first memory chips 10a to 10d. Those signals include a signal for setting, for the respective first memory chips, identification numbers identifying the first memory chips 10a to 10d, and for selecting one out of the first memory chips. After stacking a plurality of first memory chips identical in circuit configuration, different identification numbers are established respectively for the first memory chips by use of the identification-number setting signal. Designating the identification numbers allows to select one out of the first memory chips, thus avoiding the interference between the first memory chips.

Figure 2:
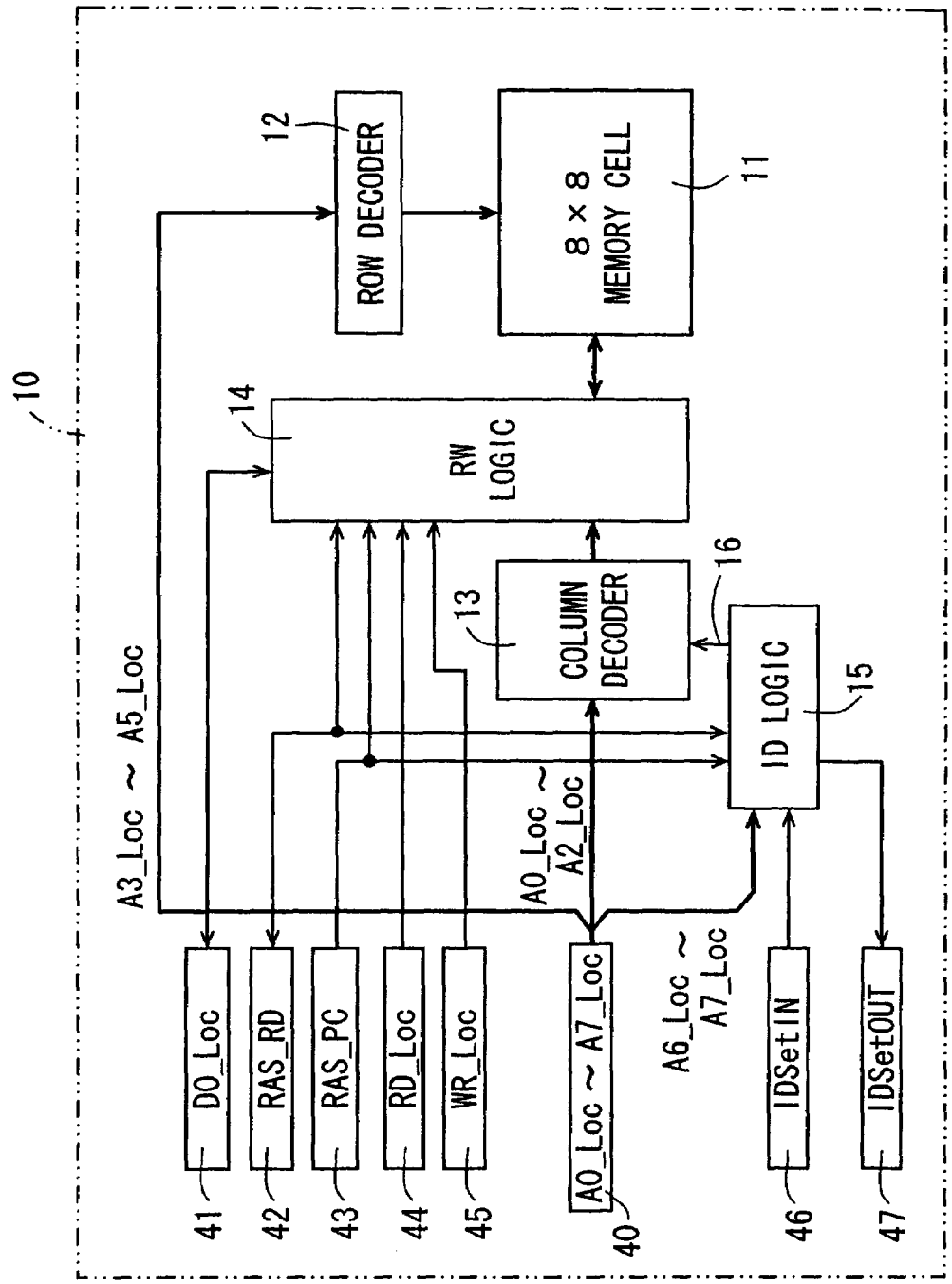
FIG. 2 is a diagram showing a circuit configuration example of a first memory chip shown in FIG. 1.

FIG. 2 is a diagram showing a circuit configuration example of the first memory chip 10 shown in FIG. 1. The first memory chip 10 includes a memory cell 11 for storing 64-bit data in an 8×8 configuration, a row decoder 12 and column decoder 13 for making effective only one out of among eight outputs by means of a 3-bit binary code, an RW logic 14 as a circuit for reading and writing data from and to a position specified by the row decoder 12 and column decoder 13, and an ID logic 15 for storing an identification number and allocating one part of a memory space of the memory device 1 to the memory cell 11 according to the identification number. The ID logic 15 compares between one part of a designated address and a stored identification number and decides an operation or non-operation of the first memory chip, thus outputting a decision result as an internal operation command output 16 to the column decoder 13.

The first memory chip 10, furthermore, includes an A0_Loc–A7_Loc terminal 40 for address designation, a D0_Loc terminal 41 for inputting or outputting data, a RAS_RD terminal 42 and RAS_PC terminal 43 for giving the operation timing of the RW logic 14, an RD_Loc terminal 44 for read designation, a WR_Loc terminal 45 for write designation, an IDSetIN terminal 46 for identification number setting, and an IDSetOUT terminal 47 for outputting a signal that turns into an IDSetIN signal for setting an identification number to the next first memory chip.

The IDSetOUT terminal 47 is daisy-chain-connected to the IDSetIN terminal 46 of the next first memory chip, thus making it possible to set up identification numbers, in order, for the first memory chips stacked. The memory device 1 is structured by stacking the first memory chips together in a direction thickness thereof, thus having an IDSetIN terminal 46 on one surface in the thickness direction and an IDSetOUT terminal 47 on the opposite and corresponding surface position in the thickness direction. By thus stacking the first memory chips each having an IDSetIN terminal 46 and IDSetOUT terminal 47 to be connected to the corresponding terminals, the first memory chips can be arranged in a daisy-chain structure. Japanese Unexamined Patent Publication JP-A 2004-264057 describes an example of a daisy-chain structure of stacked chips.

Figure 3:
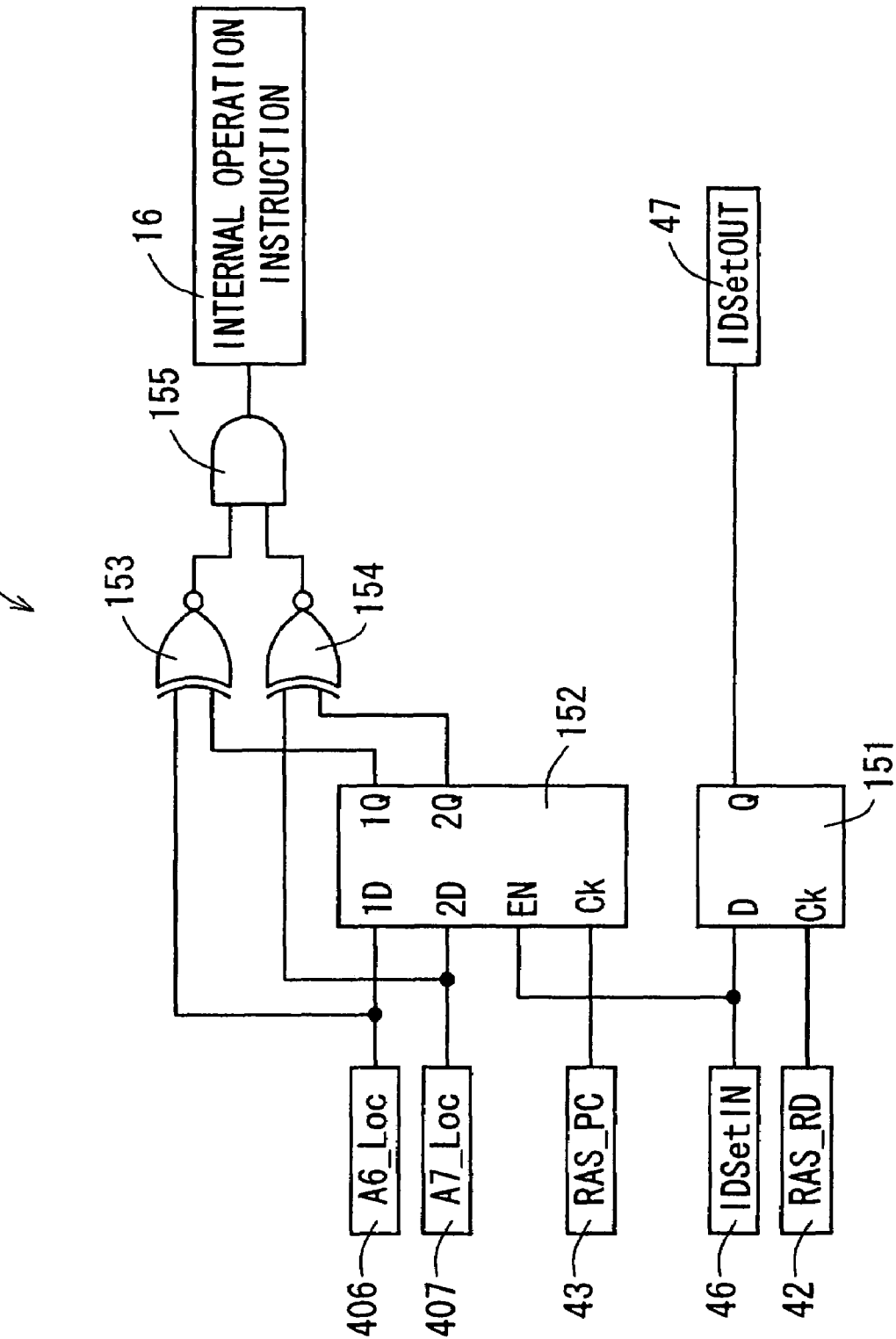
FIG. 3 is a diagram showing a detailed circuit configuration example of the ID logic shown in FIG. 2.

FIG. 3 is a diagram showing a detailed circuit configuration example of the ID logic 15 shown in FIG. 2. Although the RAS_RD terminal 42 and the RAS_PC terminal 43 are terminals for giving the operation timing of the RW logic 14, those are used also for setting up an identification number. In a D-type flip-flop 151, an output Q outputs, with somewhat time delay, the state of an input D to which a signal is inputted from the IDSetIN terminal 46 at a rise in an input Ck to which a signal is inputted from the RAS_RD terminal 42. The output Q is unchanged at other time than a rise in the input Ck.

A 2-bit D latch-with-enable 152 is identification-number storage means for storing an identification number. When the input EN to which a signal is inputted from the IDSetIN terminal 46 is active or at High level, an output 1Q and an output 2Q respectively output, with somewhat time delay, the statees of an input 1D to which a signal is inputted from the A6_Loc terminal 406 and of an input 2D to which a signal is inputted from the A7_Loc terminal 407 at a rise in the input Ck to which a signal is inputted from the RAS_PC terminal 43. The output 1Q and the output 2Q are unchanged when the input En is non-active, or at Low level, or at other time than a rise in the input Ck.

Exclusive NOR gates 153, 154 and an AND gate 155 compare between the identification number stored in the 2-bit D latch-with-enable 152, i.e. outputs 1Q and 2Q, and the address A6 of from the A6_Loc terminal 406 and address A7 of from the A7_Loc terminal 407. When agreed, an internal operation command output 16 is rendered active.

Figure 4:
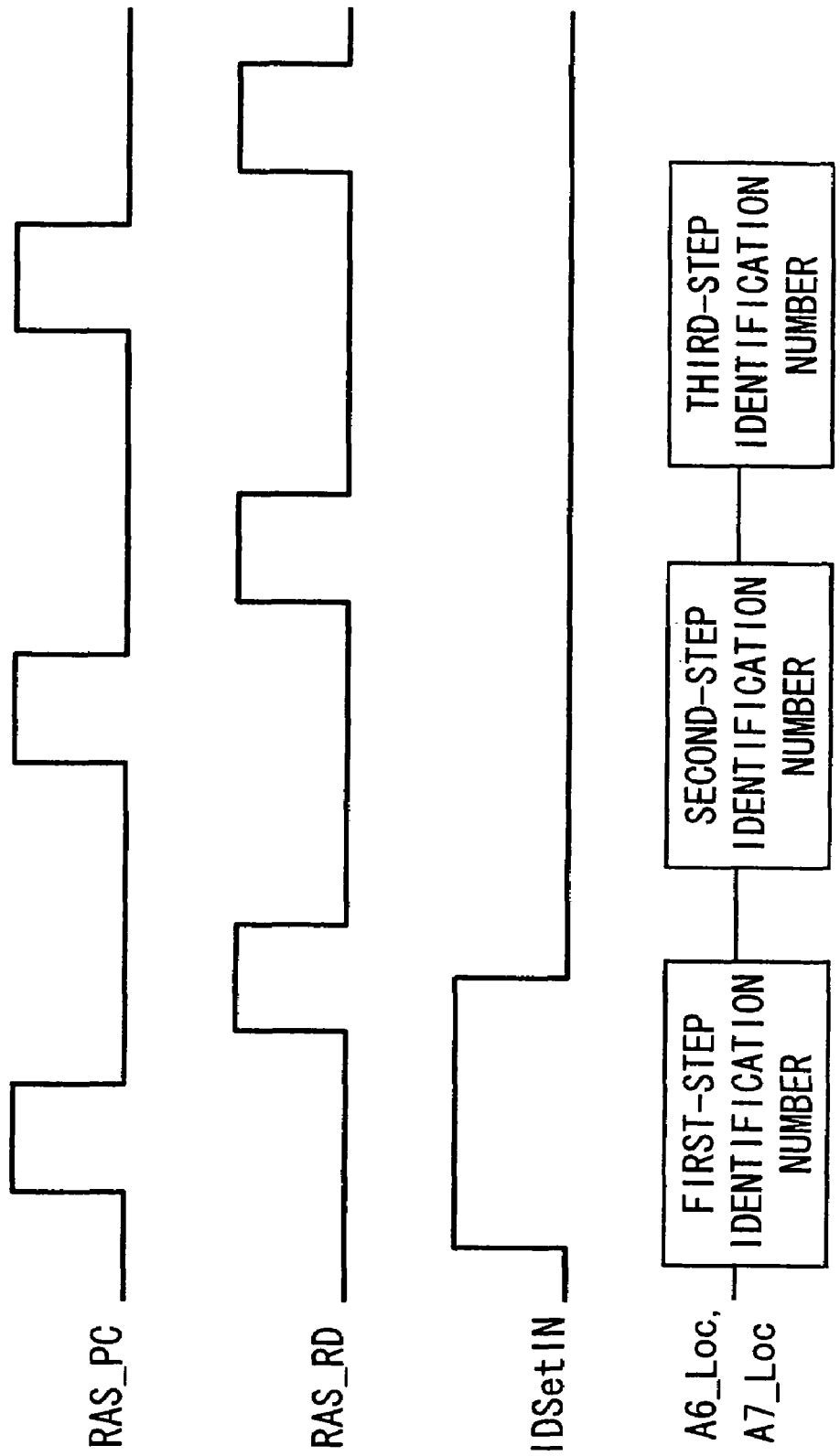
FIG. 4 is a figure showing a time chart example representative of the operation timing of the ID logic shown in FIG. 3.

FIG. 4 is a figure showing a time chart example representative of the operation timing of the ID logic 15 shown in FIG. 3. In the time chart, High level is assumed active while Low level nonactive. The rectangular portion occupying above and below of a centerline represents that setting is done with a particular value.

The identification number of the first memory chip stacked in the first step, i.e. connected in the first step, of the stacked first memory chips, is provided to an address A6 of from the A6_Loc terminal 406 and address A7 of from the terminal A7_Loc terminal 407. After the IDSetIN signal that is a signal from the IDSetIN terminal 46 is made active, booted up is a RAS_PC signal of from the RAS_PC terminal 43 which is a signal to the input Ck of the 2-bit D latch-with-enable 152. At this time, the state of address A6 and address A7 is stored in the 2-bit D latch-with-enable 152.

Subsequently, booted up is a RAS_RD signal of from the RAS_RD terminal 42 which is a signal to the input Ck of the D-type flip-flop 151. By booting up the RAS_RD signal, an IDSetOUT signal that is a signal to set an identification number to the next step of first memory chip is rendered active. When setting an identification number to the next step of first memory chip, an identification number is already set to the first step of first memory chip. Accordingly, the IDSetIN signal in the first step is rendered inactive to boot up a RAS_RD signal and RAS_PC signal. In the 2-bit D latch-with-enable 152 of the first-step of the first memory chip, the input EN for inputting an IDSetIN signal is inactive and hence the stored identification number is held as it is, thus not changing the output state.

In the second step of first memory chip, the IDSetOUT signal from the first-step first memory chip is active. The identification number of the second-step of the first memory chip, provided to the address A6 of from the A6_Loc terminal 406 and address A7 of from the A7_Loc terminal 407, is stored in the 2-bit D latch-with-enable 152. Identification numbers can be respectively set, separately, to the third step of first memory chip and the subsequent by repeating the similar operation in order.

After setting identification numbers to all the first memory chips, the IDSetIN and IDSetOUT signals are no longer active. After setting the identification numbers, the identification numbers stored are not changed even in case there is a change in the state of the RAS_PC signal and RAS_RD signal. Identification number setting, where the memory has therein a non-volatile memory, e.g. a flash memory, may be stored in the non-volatile memory. Otherwise, using a volatile memory, setting may be each time the memory device 1 is powered on.

Figure 5:
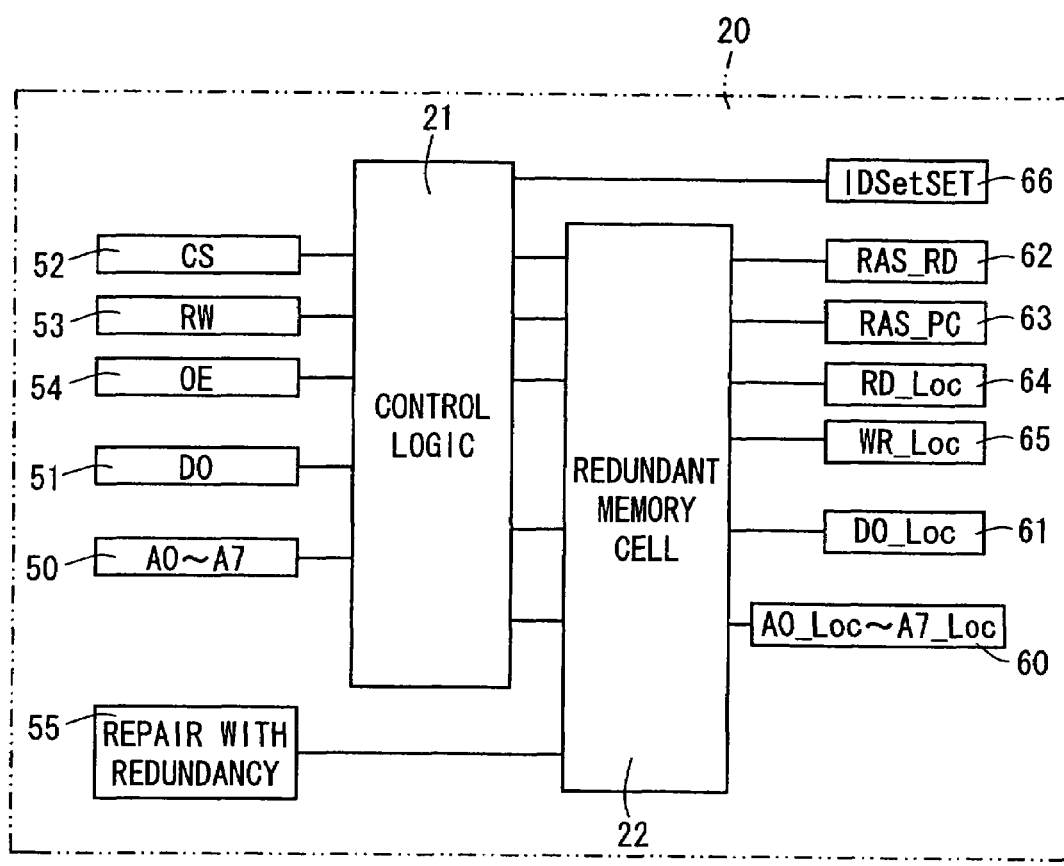
FIG. 5 is a diagram showing a circuit configuration example of a second memory chip shown in FIG. 1.

FIG. 5 is a diagram showing a circuit configuration example of the second memory chip 20 shown in FIG. 1. The second memory chip 20 includes a control logic 21 as a logic for effecting memory control and a redundant memory cell 22 for repairing an error bit of the first memory chip. Terminals 50, 51, 52, 53, 54 and 55 are respectively connected to the terminals 30–35 of the memory device 1 shown in FIG. 1. Terminals 60, 61, 62, 63, 64 and 65 are bus-connected to each of the first memory chips. The first memory chip is daisy-chain-connected and therefore an IDSetSET terminal 66, as an output terminal for outputting a signal for setting identification number, is connected to the IDSetIN terminal 46 of the first-step first memory chip.

A control logic 21 generates a timing to operate the first and second memory chips, in response to the signals at the terminals 50 to 55 electrically connected to the external of the memory device 1. Through the redundant memory cell 22, the first memory chip is operated from the terminals 60 to 65.

The redundant memory cell 22 has defect-address storage means to store a row address, column address and discrete bit address for a repair with redundancy. When the address externally designated agrees with a stored address for a repair with redundancy, the data of within the redundant memory cell is used instead of issuing a signal to the first memory chip. When the address externally designated does not agree with a stored address for a repair with redundancy, signals are outputted from the terminals 60 to 66 to the first memory chip, thereby effecting data read and write.

Figure 6:
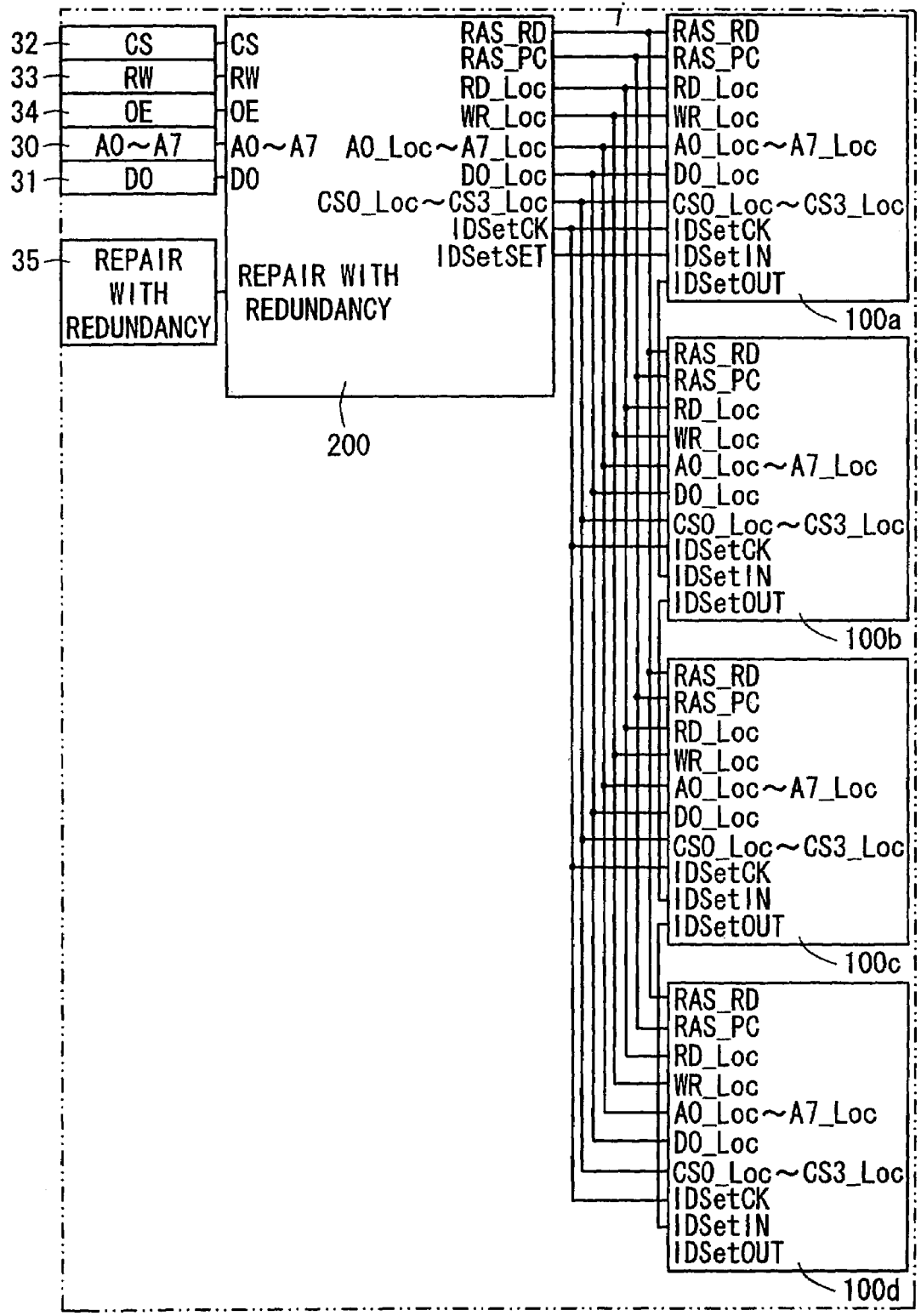
FIG. 6 is a diagram showing a circuit configuration of a memory device in a second embodiment of the invention.

FIG. 6 is a diagram showing a circuit configuration of a memory device 2 in a second embodiment of the invention. The memory device 2 includes first memory chips 100a, 100b, 100c and 100d (hereinafter sometimes collectively referred as a first memory chip 100), as first memory carrier means, and a second memory chip 200, as second memory mounting member. The difference from the memory device 1 shown in FIG. 1 lies in an increase of signals CS0_Loc to CS3_Loc and IDSetCK at between the first memory chips 100a to 100d and the second memory chip 200.

Figure 7:
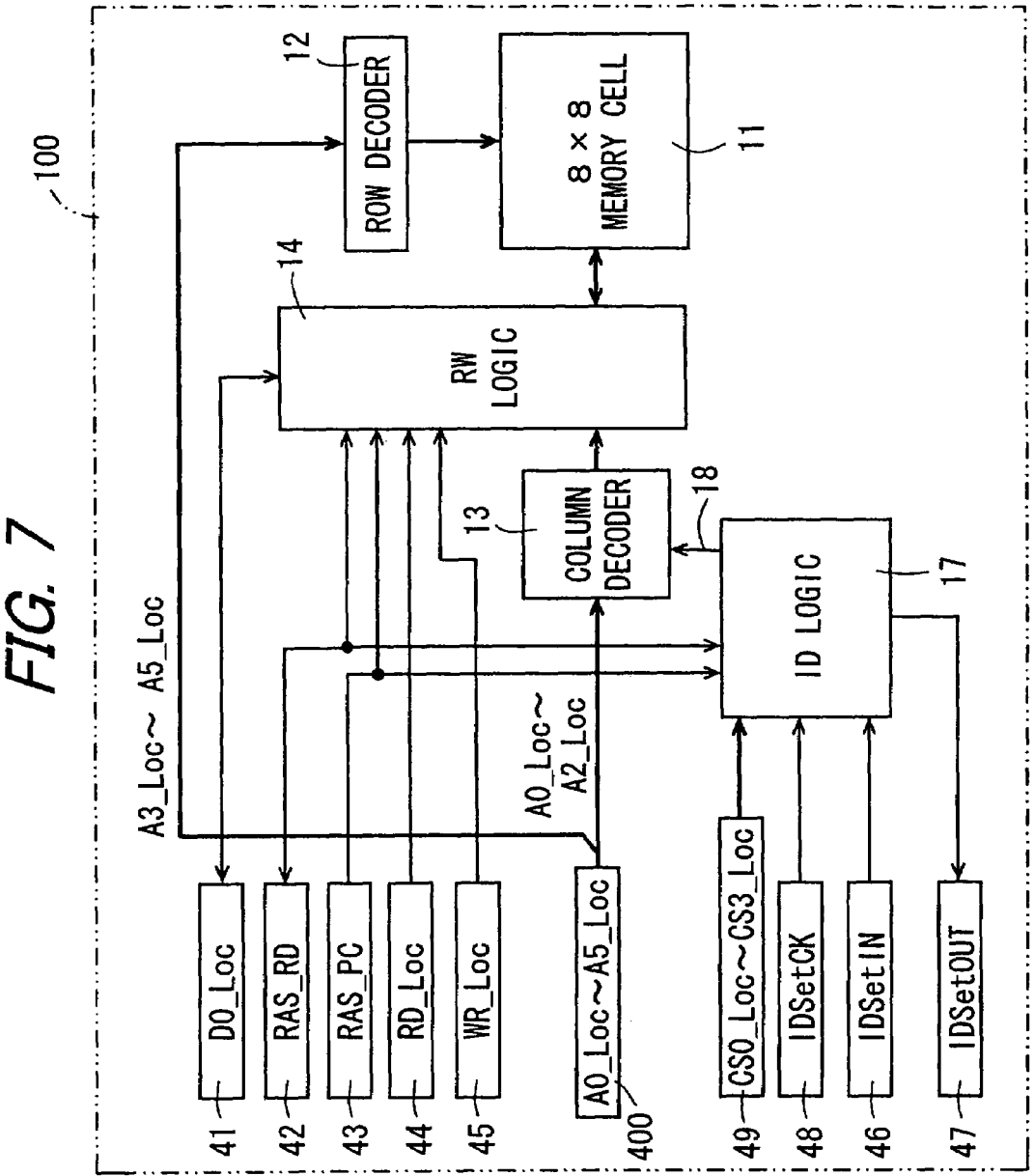
FIG. 7 is a diagram showing a circuit configuration example of a first memory chip shown in FIG. 6.

FIG. 7 is a diagram showing a circuit configuration example of the first memory chip 100 shown in FIG. 6. The first memory chip 100 has a chip select terminal 49 which is chip select means allowing to select one out of the first memory chips. The same functional elements as those of the first memory chip shown in FIG. 2 are attached with the same references, to omit duplicated explanations.

An A0_Loc–A5_Loc terminal 400 is an address terminal. Depending upon a chip select signal from the CS0_Loc–CS3_Loc terminal 49 for selecting the first memory chip, designation is made as to an operation or non-operation of the first memory chip. Accordingly, addressing signals used in addressing, are used in the number required for addressing for data read or write from or to the memory cell of within the first memory chip, e.g. 6 address signals are used in this example.

A CS0_Loc–CS3_Loc terminal 49 is a chip select input terminal that setting is possible. There are chip select input terminals in the number of first memory chips being stacked, e.g. four in this example. An IDSetCK terminal 48 is a terminal for inputting a clock signal for setting information required to select the first memory chip. The IDSetCK terminal 48 is bus-connected to all the first memory chips.

An ID logic 17 is to store the identification number of the first memory chip. The ID logic 17 is a logic that uses a clock signal inputted from the IDSetCK terminal 48 and an IDSetIN signal inputted from the IDSetIN terminal 46, to make effective one chip select input terminal of the CS0_Loc–CS3_Loc terminal 49 on each of the first memory chips and ineffective the other chip select input terminals, thus selecting and operating one out of the first memory chips being stacked. An internal-operation command signal 18 is an output signal for instructing an internal operation decided in the ID logic 17.

Figure 8:
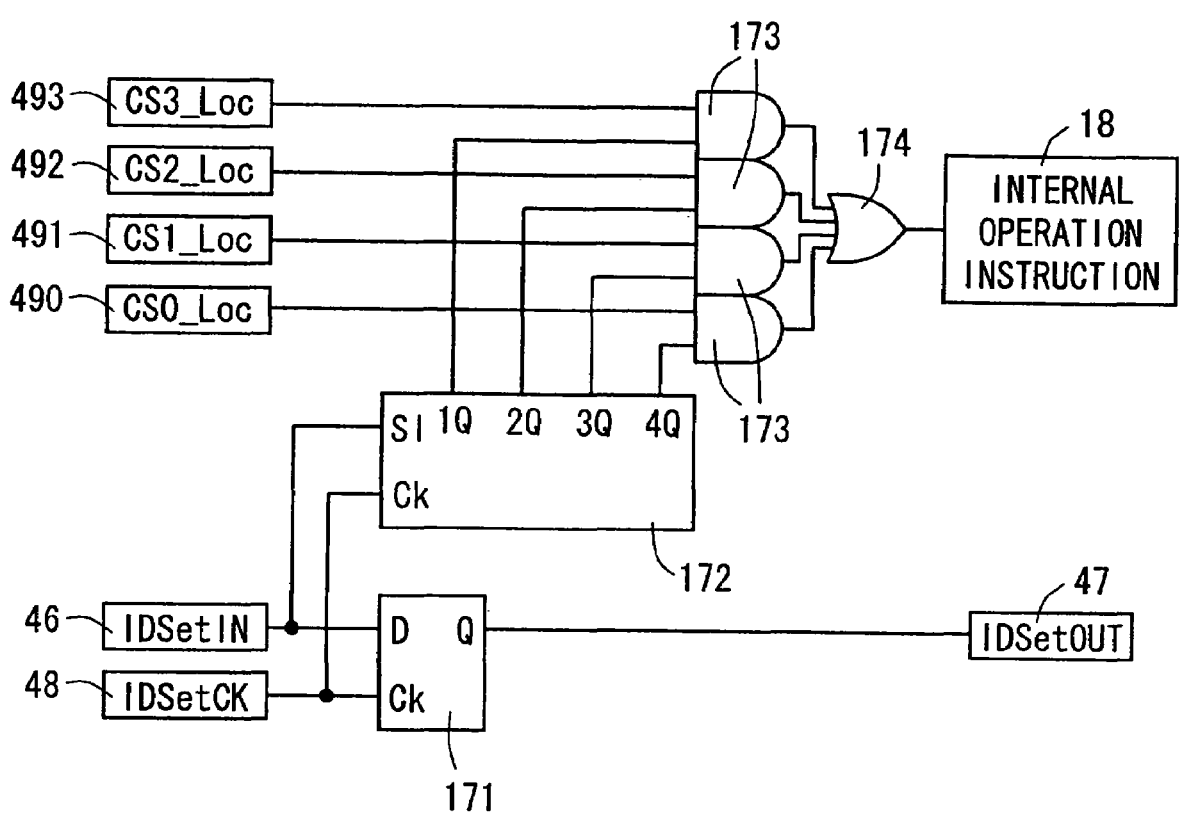
FIG. 8 is a diagram showing a detailed circuit configuration example of a ID logic shown in FIG. 7.

FIG. 8 is a diagram showing a detailed circuit configuration example of the ID logic 17 shown in FIG. 7. A D-type flip-flop 171 is similar to the D-type flip-flop 151 shown in FIG. 3. A shift register 172, in a type serial-input-and-parallel-output is to operate for causing to shift the state at output 3Q to output 4Q, the state at output 2Q to output 3Q, the state at output 1Q to output 2Q, and the state at input SI in which a signal from the IDSetIN terminal is input to output 1Q, at a rise in a signal inputted from the IDSetCK terminal 48 to the input Ck. The outputs are unchanged at other time than a rise in the signal inputted to the input Ck.

An AND gate 173 and an OR gate 174 are to select the first memory chip with its select terminal being selected for agreeing with the state stored in the shift register 172. For example, when the output 4Q is active or at High level, the internal-operation command signal 18 becomes active only when the signal at the CS0_Loc terminal 490 is active.

Figure 9:
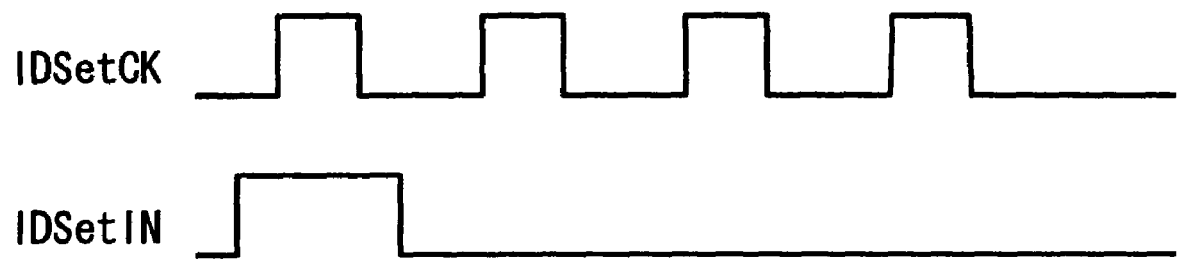
FIG. 9 is a figure showing a timing chart example showing the operation timing of thee ID logic shown in FIG. 8.

FIG. 9 is a figure showing a timing chart example showing the operation timing of the ID logic 15 shown in FIG. 8. After making active the IDSetIN signal that is a signal inputted from the IDSetIN terminal 46, raised and then fallen is a signal inputted to the respective inputs Ck of the D-type flip-flop 171 and of the serial-input-and-parallel-output shift register 172 from the IDSetCK terminal 48. At this time, the output Q of the D-type flip-flop 171 and the output 1Q of the shift register 172 becomes active.

Then, rendered inactive is the IDSetIN signal that is a signal inputted from the IDSetIN terminal 46. In case the IDSetCK signal is raised and then fallen, the output 2Q of the shift register 172 in the first-step first memory chip becomes active while the output Q of the D-type flip-flop 171 becomes inactive. At this time, the output Q of the D-type flip-flop 171 and output 1Q of the shift register 172 in the second-step first memory chip becomes active.

Similarly, when the IDSetCK signal is raised and then fallen twice, made active are the output 4Q of the shift register 172 in the first-step first memory chip, the output 3Q of the shift register 172 in the second-step first memory chip, the output 2Q of the shift register 172 in the third-step first memory chip and the output 1Q of the shift register 172 in the fourth-step first memory chip. In this manner, setting is made to select all the first memory chips by separate chip-select input signals. Any one is to be selected of whether a non-volatile memory is used as a memory to store such a state, or a volatile memory is used to make a setting each time power is turned on.

Figure 10:
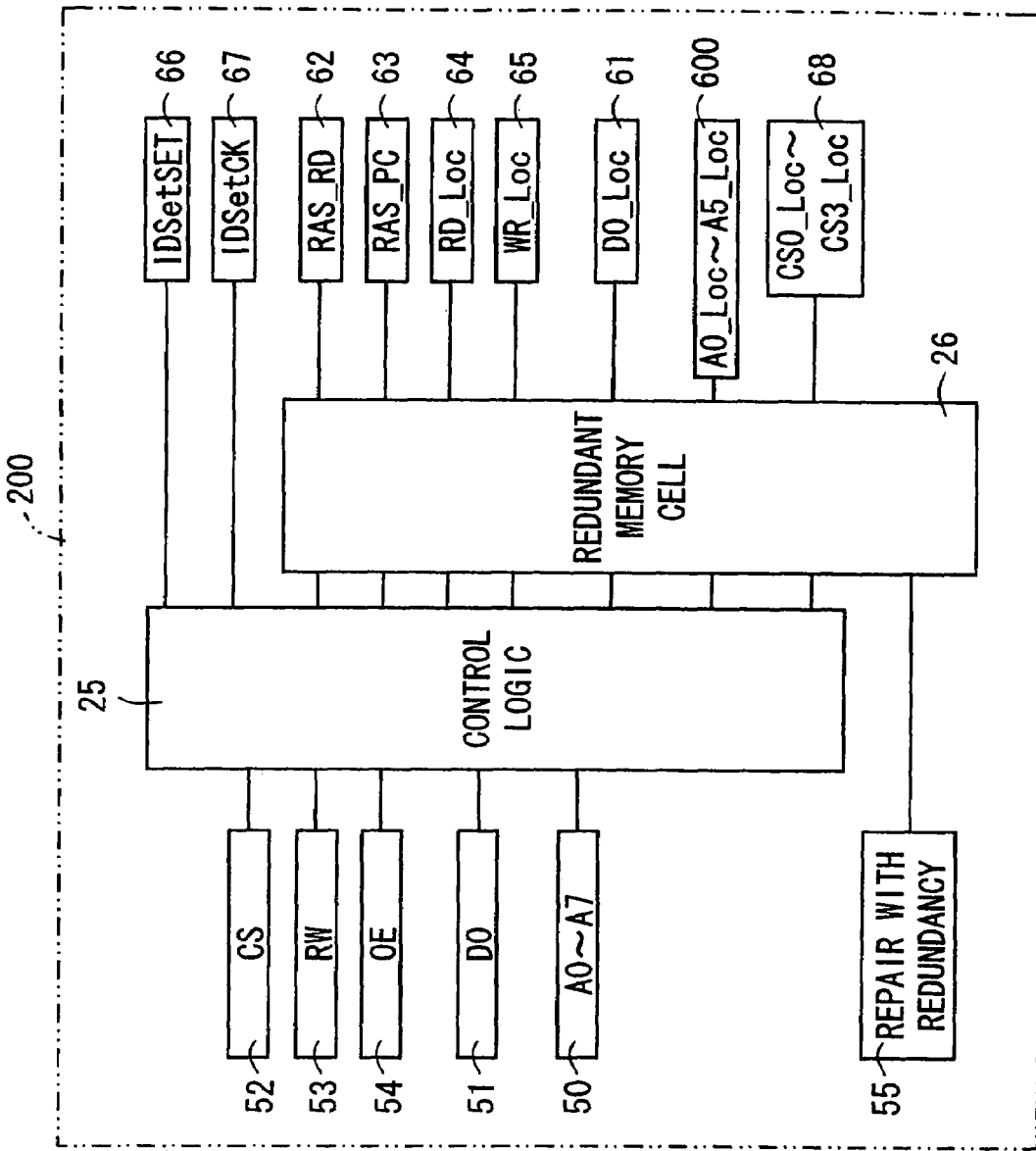
FIG. 10 is a diagram showing a circuit configuration example of a second memory chip shown in FIG. 6.

FIG. 10 is a diagram showing a circuit configuration example of the second memory chip 200 shown in FIG. 6. The second memory chip 200 includes a control logic 25 as a logic for controlling the memory and a redundant memory cell 26 for repairing an error bit of the first memory chip.

Terminals 50 to 55 are respectively connected to the terminals 30 to 35 of the memory device 1 shown in FIG. 1. Terminals 61 to 65, a terminal 600 and a chip-select terminal 68 are bus-connected to the respective first memory chips. An IDSetSET terminal 66, daisy-chain-connected with the first memory chip, is an output terminal for outputting a signal for identification number setting, thus being connected to the IDSetIN terminal 46 of the first-step first memory chip. An IDSetCK terminal 67 is a terminal for outputting a clock signal for identification number setting.

A control logic 25 generates a timing to operate the first and second memory chips, in response to the signals at the terminals 50 to 55 electrically connected to the external of the memory device 1. Through the redundant memory cell 26, the first memory chip is operated from the terminals 61 to 65, terminal 600 and terminal 68.

The redundant memory cell 26 has defect-address storage means for storing a row address, column address and discrete bit address for a repair with redundancy. When the address externally designated agrees with a stored address for a repair with redundancy, the data within the redundant memory cell is used not to issue a signal to the first memory chip. When the address externally designated does not agree with a stored address for a repair with redundancy, signals are outputted from the terminal 61 to 65, terminal 600 and terminal 68 to the first memory chip, thus effecting data read or write.

In order to designate whether to operate or not to operate the first memory chip by use of a chip select signal, a chip select signal is generated by using the remaining signals excluding the signals for designating the memory cell addresses of the first memory chip from among the signals for designating all the addresses. For example, this embodiment is to generate a chip select signal by use of addresses A6 and A7.

Figure 11:
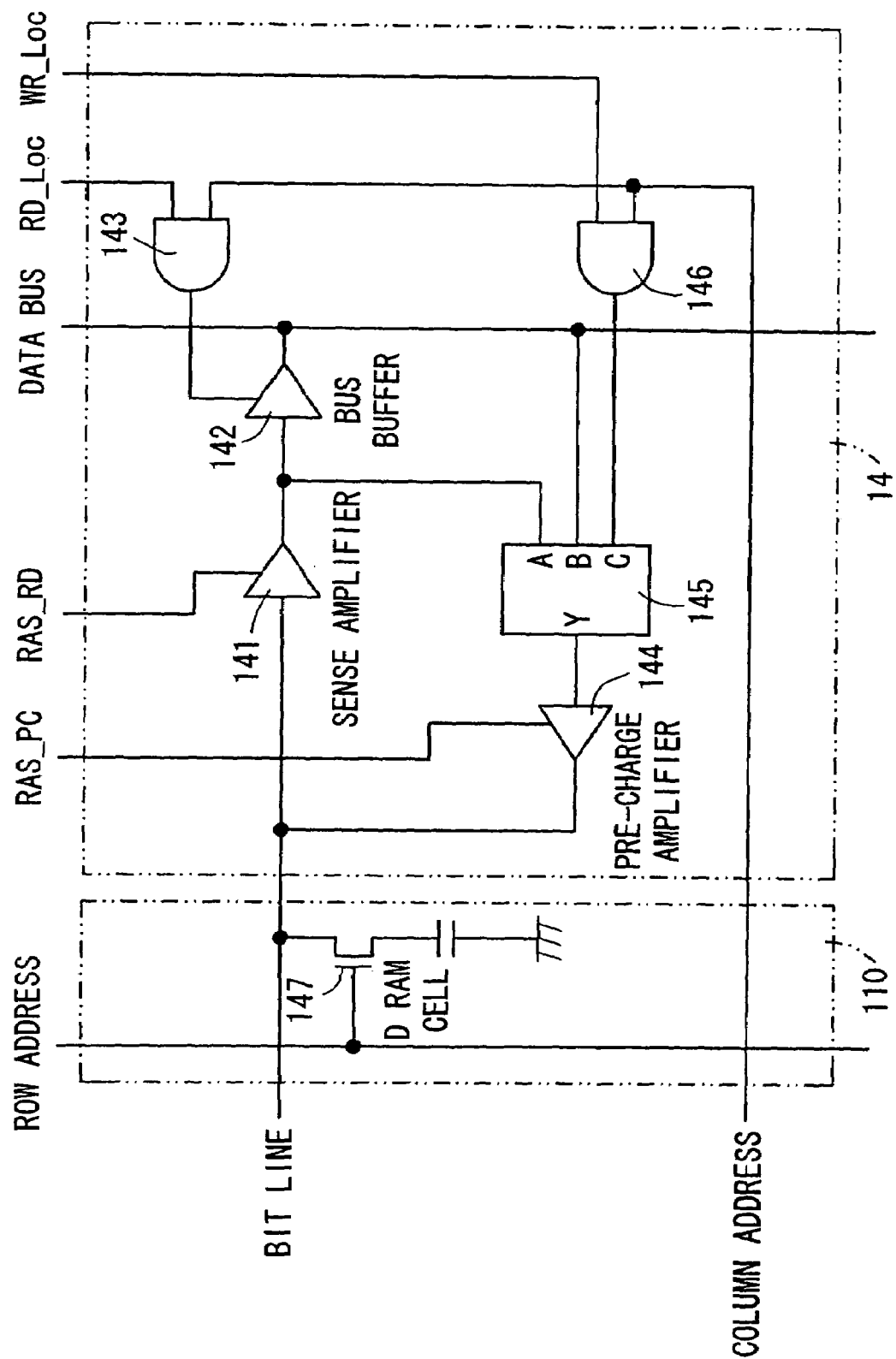
FIG. 11 is a figure showing a detailed circuit configuration example of a RW logic shown in FIGS. 2 and 7.

FIG. 11 is a figure showing a detailed circuit configuration example of the RW logic 14 shown in FIGS. 2 and 7. The circuit configuration of the RW logic 14 shows an example using a DRAM as a first memory chip memory cell and second memory chip redundant memory cell. The DRAM cell 147, in the memory cell and redundant memory cell, is to store 1-bit data selected by an row address and output the amount of a storage charge through a bit line. In response to a RAS_RD signal, a sense amplifier 141 compares, in digitalization, the amount of a charge stored on the DRAM cell 147 with a predetermined reference value. Namely, output is made by deciding whether the stored data is "1" or "0" in value. A bus buffer 142 outputs the output of the sense amplifier 141 onto the data bus when an AND gate 143 is active, i.e. when the RD_Loc signal representative of read is active and the column address is active.

A precharge amplifier 144 is to write back a value-broken-upon-reading to the DRAM cell 147 and write a new-write-value to the DRAM cell 147, in response to a RAS_PC signal. A data selector 145 operates to output an input B from an output Y when an input C is active, and output an input A from an output Y when the input C is inactive. When a WR_Loc signal representative of write is active and the column address is active, an AND gate 146 is active in its output. When the output of the AND gate 146 is active, a data-bus value is provided to the precharge amplifier 144 through an input B of the data selector 145 and written as a new value to the DRAM cell 147. In other cases, the output of the sense amplifier 141 is given as an input to the precharge amplifier 144 through an input A of the data selector 145. Thus, a value-broken-by-reading is written back to the DRAM cell.

Figure 12:
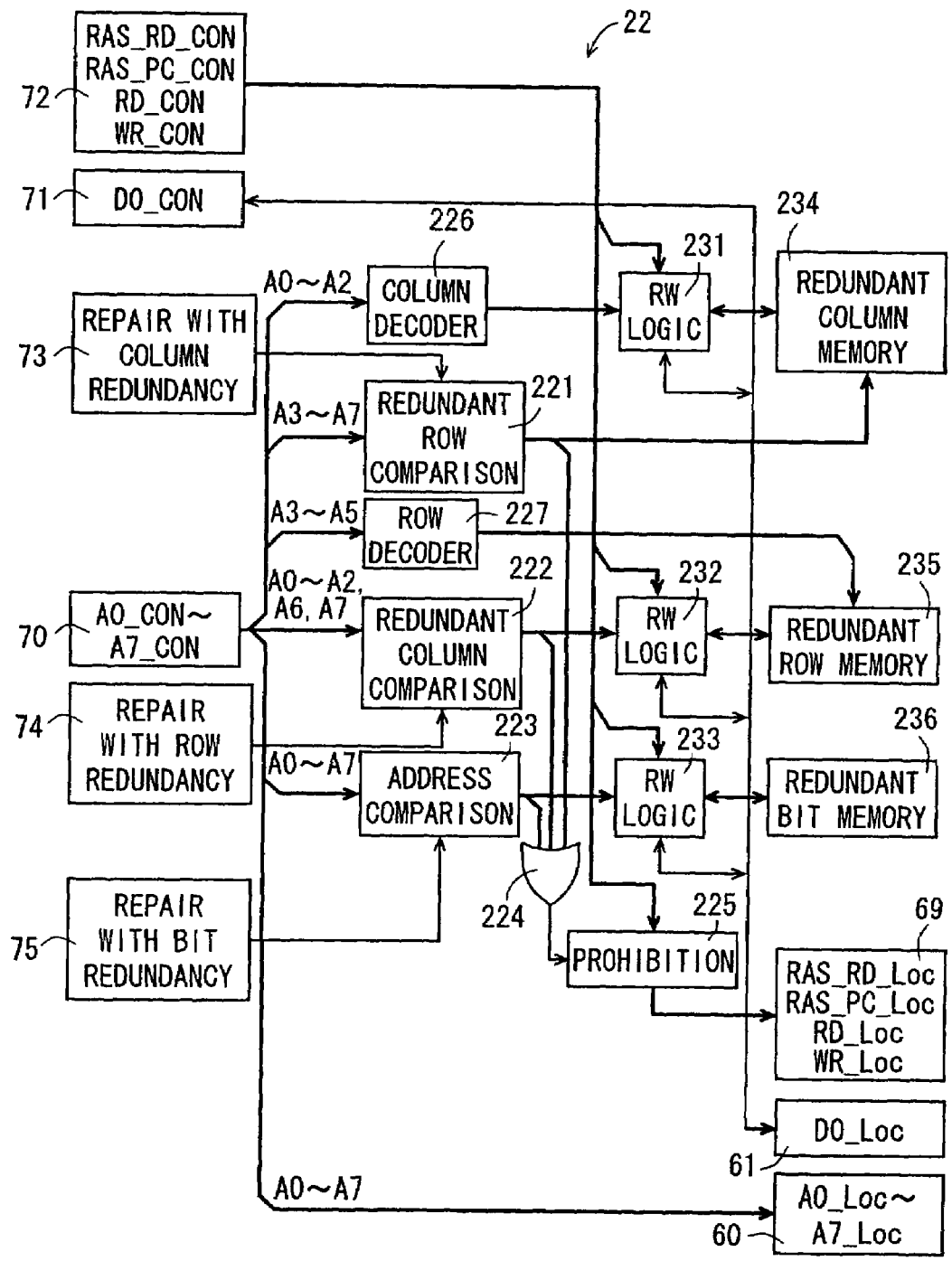
FIG. 12 is a diagram showing a circuit configuration example of a redundant memory cell shown in FIG. 5.

FIG. 12 is a diagram showing a circuit configuration example of the redundant memory cell 22 shown in FIG. 5. A terminal 70 is a terminal for inputting an A0_CON–A7_CON signal as an address signal from the control logic 21. A terminal 71 is a terminal for inputting and outputting a D0_CON signal as a data signal from and to the control logic 21. A terminal 72 is a terminal for inputting an RAS_RD_CON signal, an RAS_PC_CON signal, an RD_CON signal and WR_CON signal that are timing signals from the control logic 21.

Terminals 73, 74 and 75 are terminals for inputting a signal for a repair with redundancy, including a repair-with-column-redundancy terminal 73, a repair-with-row-redundancy terminal 74 and a repair-with-bit-redundancy terminal 75. Although this example uses three terminals as terminals for a repair with redundancy, the terminal for a repair with redundancy may be provided one by multiplexing with other signals.

Terminals 60, 61 and 69 are terminals for outputting signals to the first memory chip. An A0_CON_CON–A7_CON signal as an address signal and a D0_CON signal as a data signal are respectively connected, in the bus structures as they are, to an A0_Loc–A7_Loc signal on the terminal 60 and a D0_Loc signal on the terminal 61.

Timing signals RAS_RD_CON, RAS_PC_CON, RD_CON and WR_CON are outputted as signals RAS_RD_CON, RAS_PC, RD_Loc and WR_Loc from the terminal 69 when not performing a repair with redundancy. When performing a repair-with-redundancy, an OR gate 224 is active in its output, thus making effective the prohibition portion 225 for output prohibition. Thus, signals RAS_RD, RAS_PC, RD_Loc and WR_Loc are not outputted from the terminal 69.

A redundant column memory 234 is a memory for repairing the erroneous bits of the memory cell on a row-by-row basis. A redundant row memory 235 is a memory for repairing the erroneous bits of the memory cell on a column-by-column basis. A redundant bit memory 236 is a memory for repairing the erroneous bits of the memory cell on a bit-by-bit basis. A column decoder 226 is a decoder for decoding an address designating a column. The column decoder 226 has an output that is inputted to the redundant column memory 234 through an RW logic 231. A row decoder 227 is a decoder for decoding an address designating a row, whose output is to be directed to the redundant row memory 235. From now on, repairing the error bits of the memory cell on a row-by-row basis is referred to as a repair-with-column-redundancy, repairing those on a column-by-column basis is as a repair-with-row-redundancy, and repairing those on a bit-by-bit basis is as a repair-with-bit-redundancy.

A redundant row comparison device 221 includes defect-address storage means for storing an address of a row for a repair with column redundancy, and comparator means for comparing between a designated address and a stored address. A redundant column comparison device 222 includes defect-address storage means for storing an address of a column for a repair with row redundancy, and comparator means for comparing between a designated address and a stored address. An address comparison device 223 includes defect-address storage means for storing an address for a repair with bit redundancy, and comparator means for comparing between a designated address and a stored address. When the signal from the repair-with-column-redundancy terminal 73, the repair-with-row-redundancy terminal 74 and the repair-with-bit-redundancy terminal 75 are active in these comparison devices 221, 222, and 223, the address of an erroneous bit of the memory cell is stored.

An RW logic 231, an RW logic 232 and an RW logic 233 are logics for controlling to read and write data to and from the redundant column memory 234, the redundant row memory 235 and the redundant bit memory 236, according to the timing signals RAS_RD_CON, RAS_PC_CON, RD_CON and WR_CON, respectively.

A redundant row comparison device 221, a redundant column comparison device 222 and an address comparison device 223 each compare the designated address with a stored address. When the address compared is in agreement, read or write instruction is made to the redundant row memory 234, the redundant row memory 235 and the redundant bit memory 236, respectively. The fact of making a repair with redundancy by use of the redundant row memory 234, the redundant column memory 235 and redundant bit memory 236 makes effective the prohibition portion 225 through the OR gate 224 not to output a timing signal to the first memory chip, thus suppressing the operation of the first memory chip. This can prevent simultaneous output of data from a plurality of memory chips, i.e. interference of data.

Figure 13:
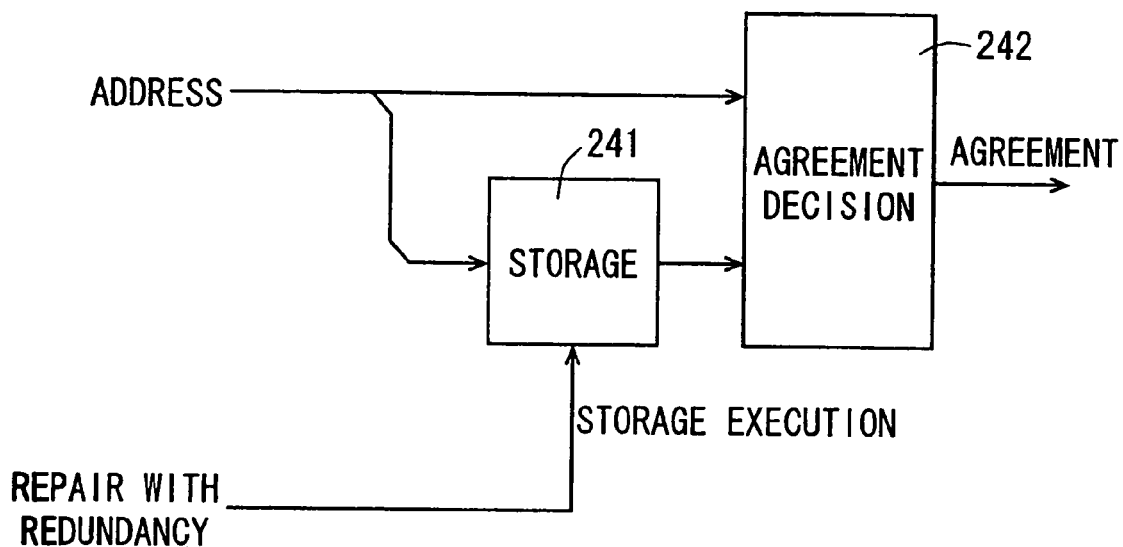
FIG. 13 is a diagram showing a circuit configuration example of a redundancy comparator circuit.

FIG. 13 is a diagram showing a circuit configuration example of a redundancy comparator circuit. The redundancy comparator circuit is a circuit that stores an address for a repair with redundancy and compares a designated address with a stored address, i.e. a circuit used in the redundant row comparison device 221, the redundant column comparison device 222 and address comparison device 223. The redundancy comparator circuit includes storage means 241 as defect-address storage means and an agreement decision portion 242 as comparator means for comparing a designated address with an address stored in the storage means 241.

The storage means 241, such as a latch or a non-volatile memory, is instructed for storage execution to store the address being inputted when a repair-with-redundancy signal representative of performing a repair with redundancy becomes active. This example shows the case to store an address itself for a repair with redundancy. The storage means 241, of the address comparison device 223 for bit-based repair with redundancy, stores all the address signal values. The respective ones of storage means 241, in the redundant row comparison device 221 and the redundant column comparison device 222, respectively store a row address of a row for a repair with redundancy and a column address of a row for a repair with redundancy.

Figure 14:
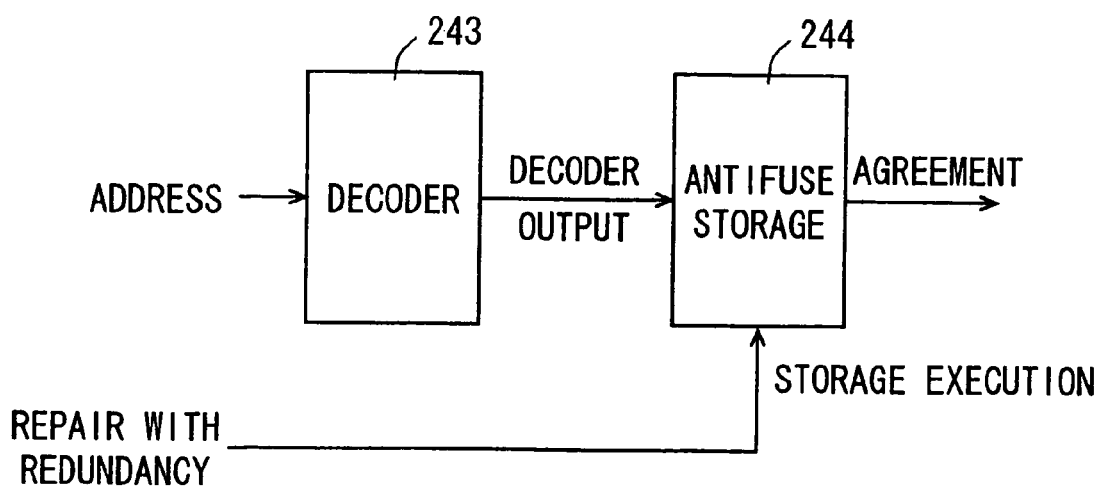
FIG. 14 is a diagram showing another circuit configuration example of the redundant comparator circuit.

FIG. 14 is a diagram showing another circuit configuration example of the redundant comparator circuit. This is in a different scheme from the redundant comparator circuit shown in FIG. 13. For a output on an input address decoded by a decoder 243, this causes antifuse storage means 244 or the like to store a presence or absence of a repair with redundancy. This scheme is suited for repairing a row or a column with redundancy because address decoding and storage can be effected at one time.

Figure 15:
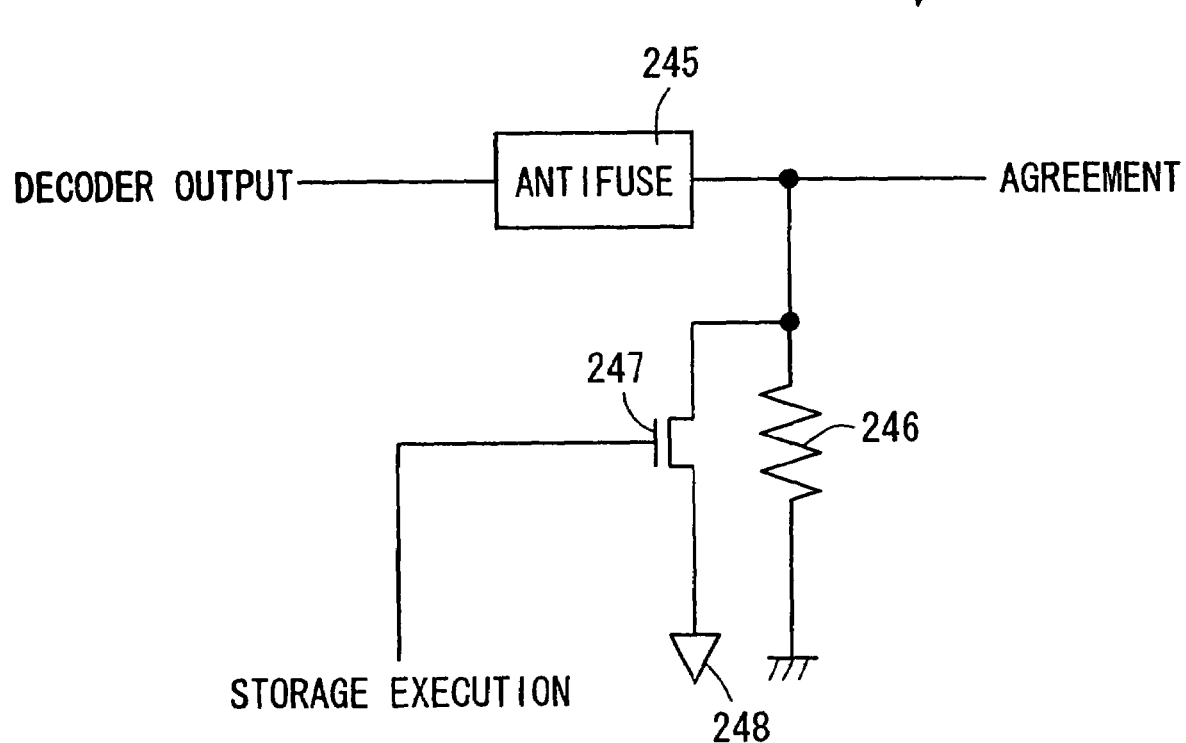
FIG. 15 is a diagram showing a circuit configuration of an antifuse storage means shown in FIG. 14.

FIG. 15 is a diagram showing a circuit configuration of the antifuse storage means 244 shown in FIG. 14. Although an antifuse 245 is high in impedance before storing the output of the decoder 243, it becomes low in impedance after storing the output of the decoder 243. A resistance 246 is a resistance for stabilizing the pre-storage state. The resistance 246 is of an impedance in value lower than the impedance of the antifuse 245 not storing the output of the decoder 243 but sufficiently higher than the impedance of the antifuse 245 storing the output of the decoder 243.

A transistor 247 is a transistor for causing the antifuse 245 to store the output of the decoder 243. A power source 248 is a power source for causing the antifuse 245 to store the output of the decoder 243. Storage to the antifuse 245 is effected by making the output of the decoder 243 in a state for storage, i.e. High in level, making active the signal for executing storage to thereby place the transistor 247 conductive, and applying a voltage for operating the antifuse to both ends of the antifuse 245. In case applying a voltage for operating the antifuse to both ends of the antifuse 245, the antifuse 245 changes into a low-impedance state, i.e. a storage state. After the change into the storage state, an output of agreement is issued when the output of the decoder becomes a state of storage, i.e. High in level.

Figure 16:
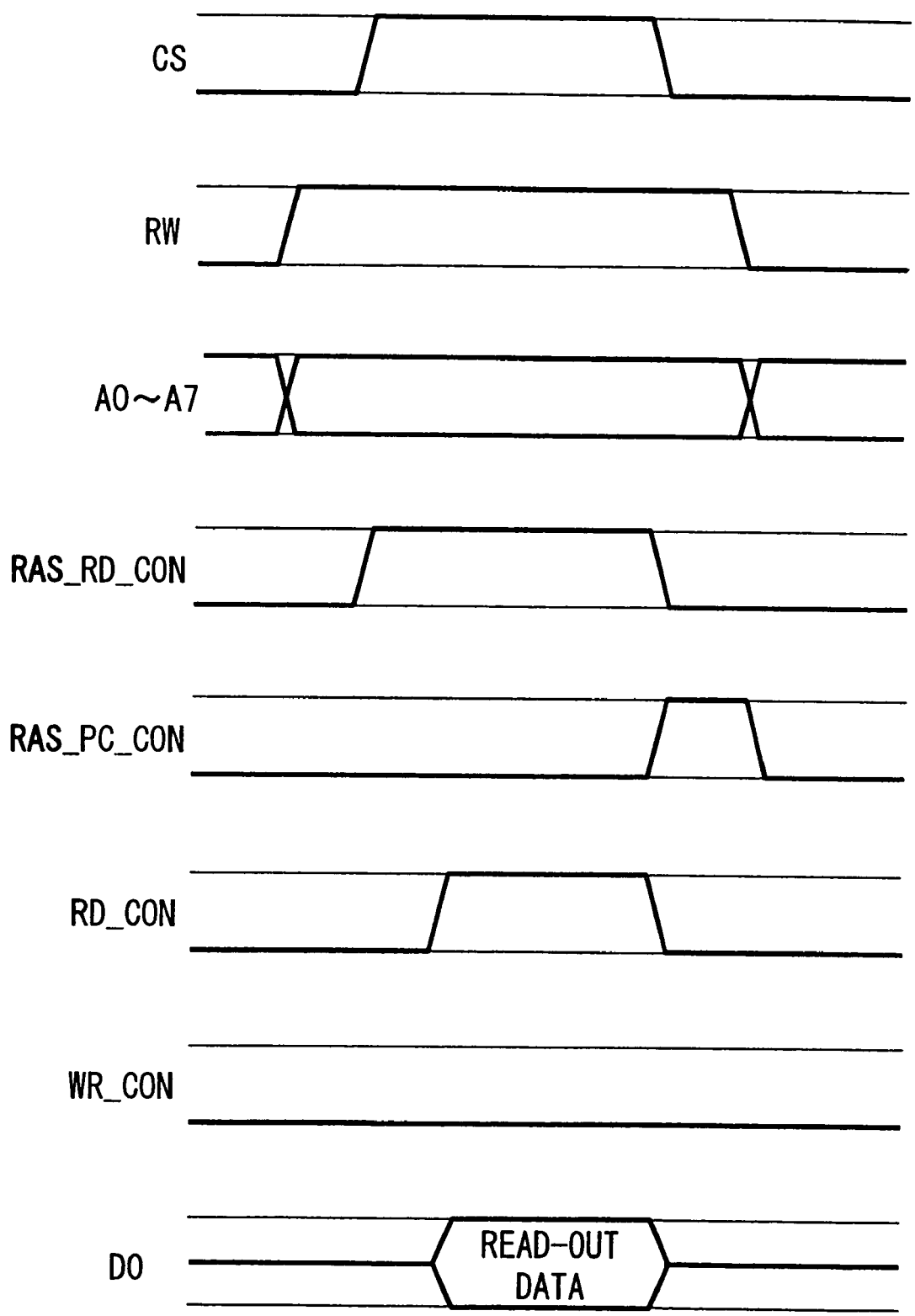
FIG. 16 is a figure showing an example of a time chart during reading from a pseudo SRAM.

FIG. 16 is a figure showing an example of a time chart during reading from a pseudo SRAM. There is shown timing of related signals in the case of operating, as a pseudo SDRAM, a DRAM used as a memory cell of the first memory chip and redundant memory cell of the second memory chip.

The related signals include a chip select CS signal for selecting a first memory chip, an RW signal for write or read designation, an A0–A7 signal for address designation, a RAS_RD_CON signal as row read timing, a RAS_PC_CON signal as row rewrite timing, a RD_CON signal as column read timing, a WR_CON signal as column write timing, and a D0 signal as a data signal. The CS signal, the RW signal and the A0–A7 signal are input signals to the memory device 1 while the D0 signal is an input signal to the memory device 1 and an output signal from the memory device 1. The RAS_RD_CON signal, the RAS_PC_CON signal, the RD_CON signal and WR_CON signal are input signals from the control logic of the second memory chip to the redundant memory cell.

During the CS signal is active, or High level, the RW signal is at High level representative of read. The address A0–A7 signal designates an address for read during the CS signal is active. When the row read timing RAS_RD_CON signal becomes active following the CS signal, data is read from the row of the memory cell storing data. When reading from the row completes by the RAS_RD_CON signal, the RAS_RD_CON signal becomes active and the data on the column designated by the address signal of among those of one row read out is output to the D0 signal.

Because data read out of the DRAM results in destructive reading, there is a need to write back the row data read out. The write back of data is effected by making the RAS_PC_CON signal active when the CS signal is inactive, i.e. Low in level. This can be carried out without providing an especial signal from the external of the memory device 1.

Figure 17:
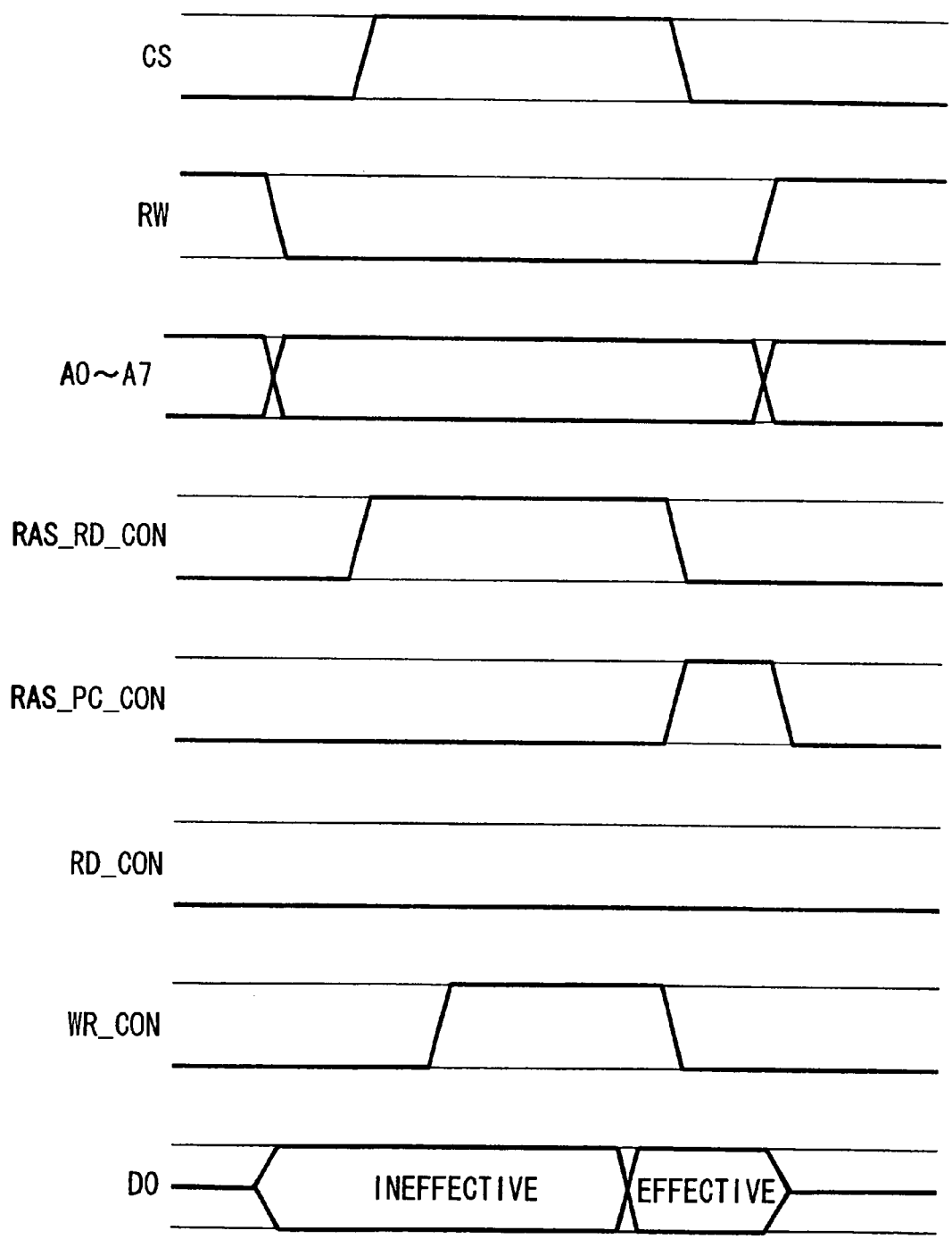
FIG. 17 is a figure showing an example of a time chart during writing to a pseudo SRAM.

FIG. 17 is a figure showing an example of a time chart during writing to a pseudo SRAM. The signals related are similar to the signals shown in FIG. 16. While the CS signal is active, the RW signal is Low in level representative of write. The address A0–A7 signal designates an address where to write during the CS signal is active. When the RAS_RD_CON signal becomes active following the CS signal, data is read out of the row including the address where to write data.

Then, when reading from the row is completed by the RAS_RD_CON signal, the column write timing WR_CON signal becomes active, to overwrite the data of the column designated by the address signal of among one row read out onto the value given by D0 signal. Writing one-row data including the overwritten value is made by making the RAS_PC_CON signal active when the CS signal is inactive, similarly to the write back during read. This can be carried out without providing an especial signal from the external of the memory device 1.

Figure 18:
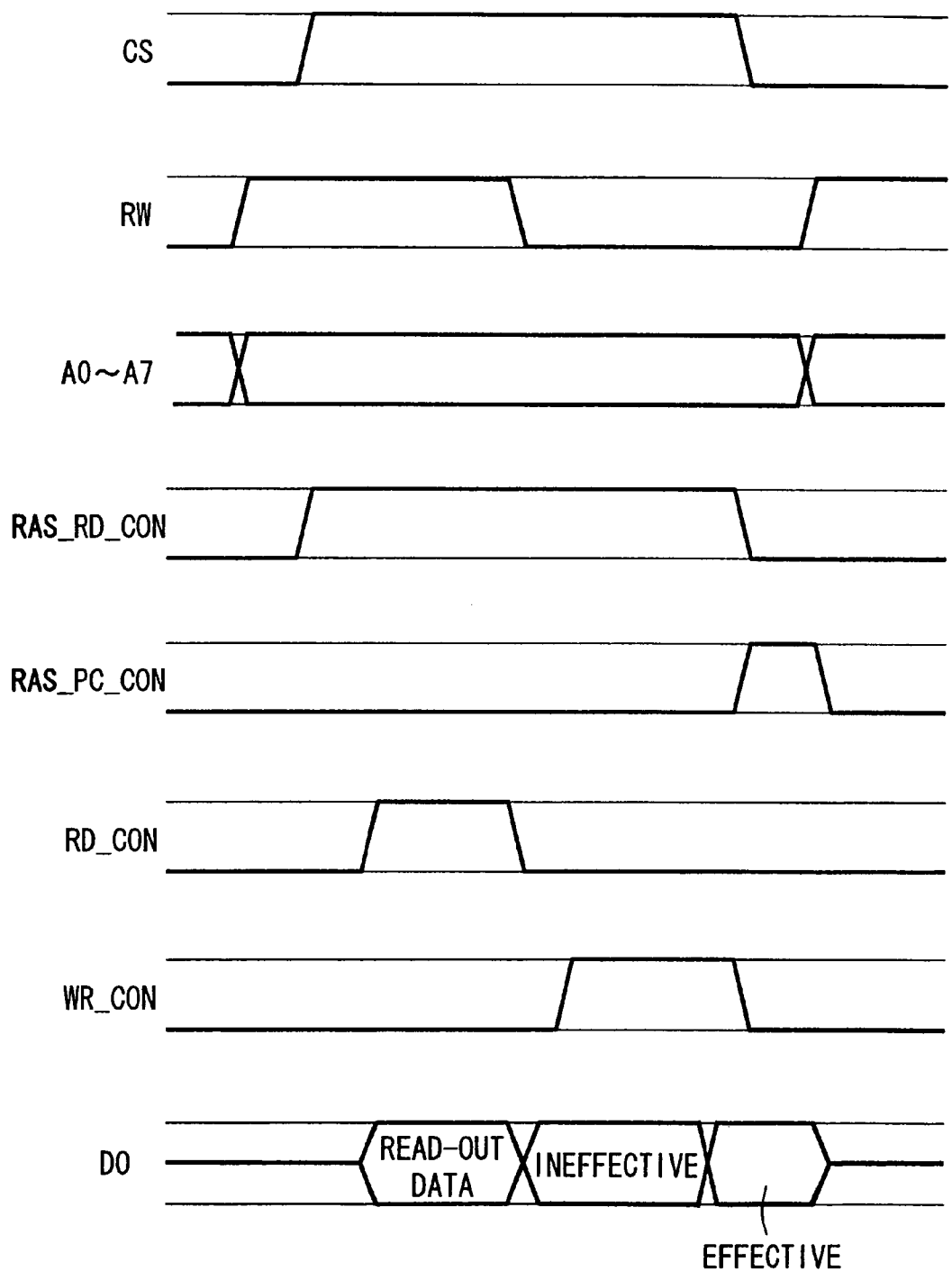
FIG. 18 is a figure showing an example of a time chart upon read-modify-write to the pseudo SRAM.

FIG. 18 is a figure showing an example of a time chart upon read-modify-write to the pseudo SRAM. Read-modify-write is to write data and read data within one memory cycle. The signals related are similar to the signals shown in FIG. 16. While the CS signal is being active, the RW signal assumes initially a High level representing to read and then turns into a Low level representing to write. The address A0–A7 signal designates address for read and write while the CS signal is being active.

When the RAS_RD_CON signal becomes active following the CS signal, data is read out of the row of the memory cell storing data. When reading from the row is completed by the RAS_RD_CON signal, the RD_CON signal becomes active, to output the data of the column designated by the address signal of one row read out to the D0 signal.

When the RW signal changes into a Low level representative of write in order to write data, the RD_CON signal becomes inactive and ceases the output of data to the D0 signal. Subsequently, by making the WR_CON signal active, overwrite is made with the data designated by the D0 signal. Write back of the one-row data including the overwritten data is effected by making the RAS_PC_CON signal active when the CS signal is inactive, similarly to write back in reading. This can be carried out without providing an especial signal from the outside of the memory device 1.

Those operations are done in the timing generated by the control logic. Regulating the signal timing is feasible by using a delay line, CR (capacitor-resistor) delay generation circuit or the like.

Figure 19:
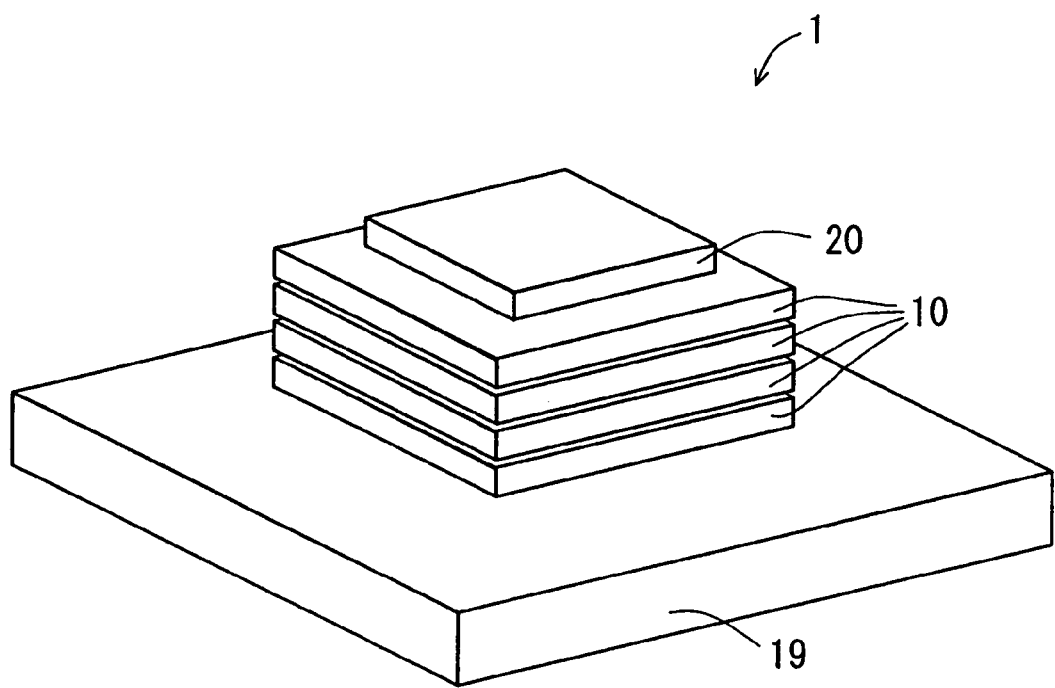
FIG. 19 is a perspective view showing an example of exterior view of the memory device shown in FIG. 1.

FIG. 19 is a perspective view showing an example of exterior view of the memory device 1 shown in FIG. 1. The memory device 1 is structured by stacking four first memory chips 10 and one second memory chip 20 in a direction thickness thereof. Those memory chips are fixed on a support 19. In the memory device 1, the terminals of the memory chips are electrically connected by the electrodes provided penetrating the memory chips thickness, as shown in FIG. 1. By thus connecting and stacking the memory chips together thickness, the time difference in signal propagation can be greatly reduced to an extreme extent. The one example of memory device 2 shown in FIG. 6 is similar in exterior view to the perspective view shown in FIG. 19.

Figure 20A:
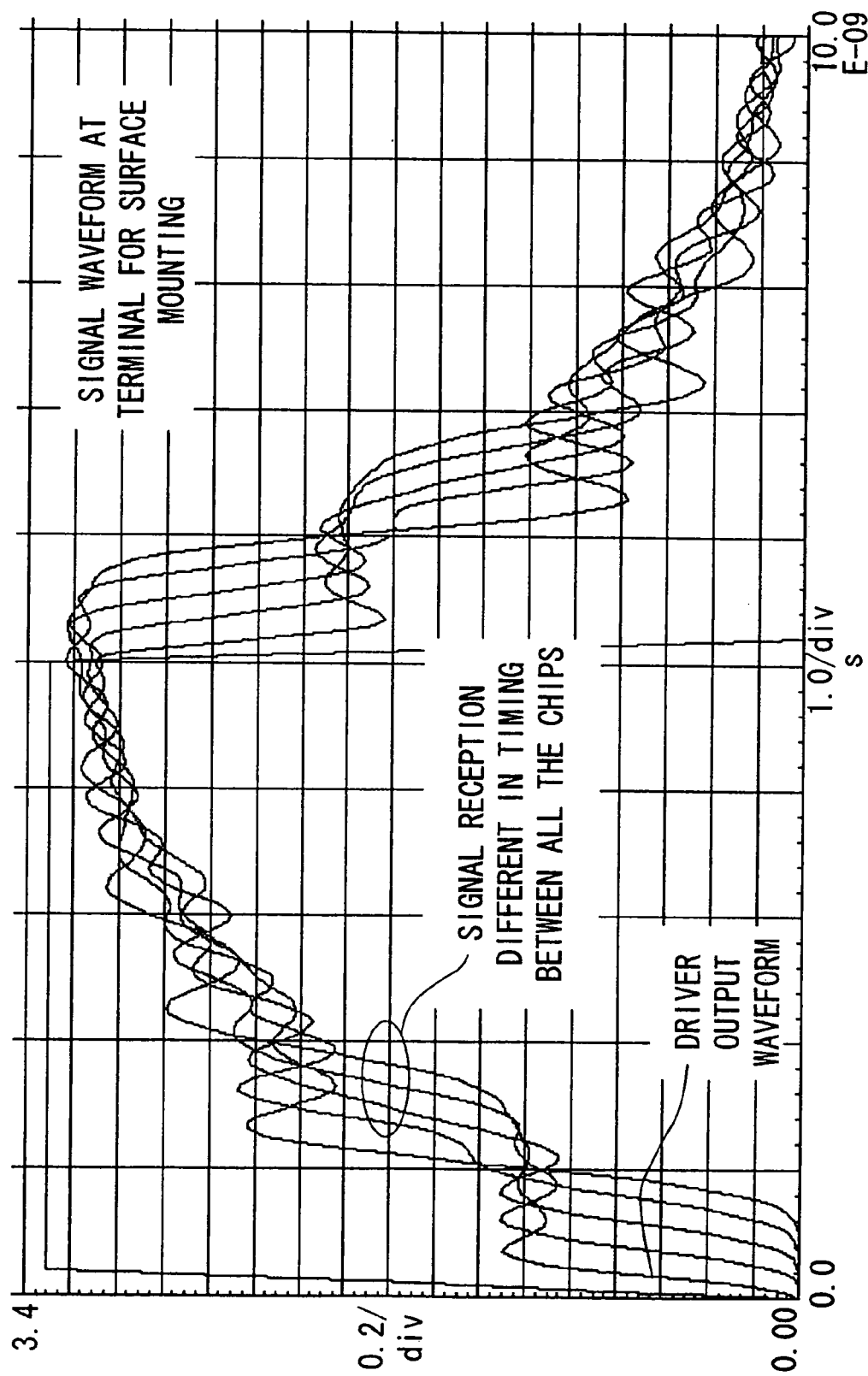
Figure 21:
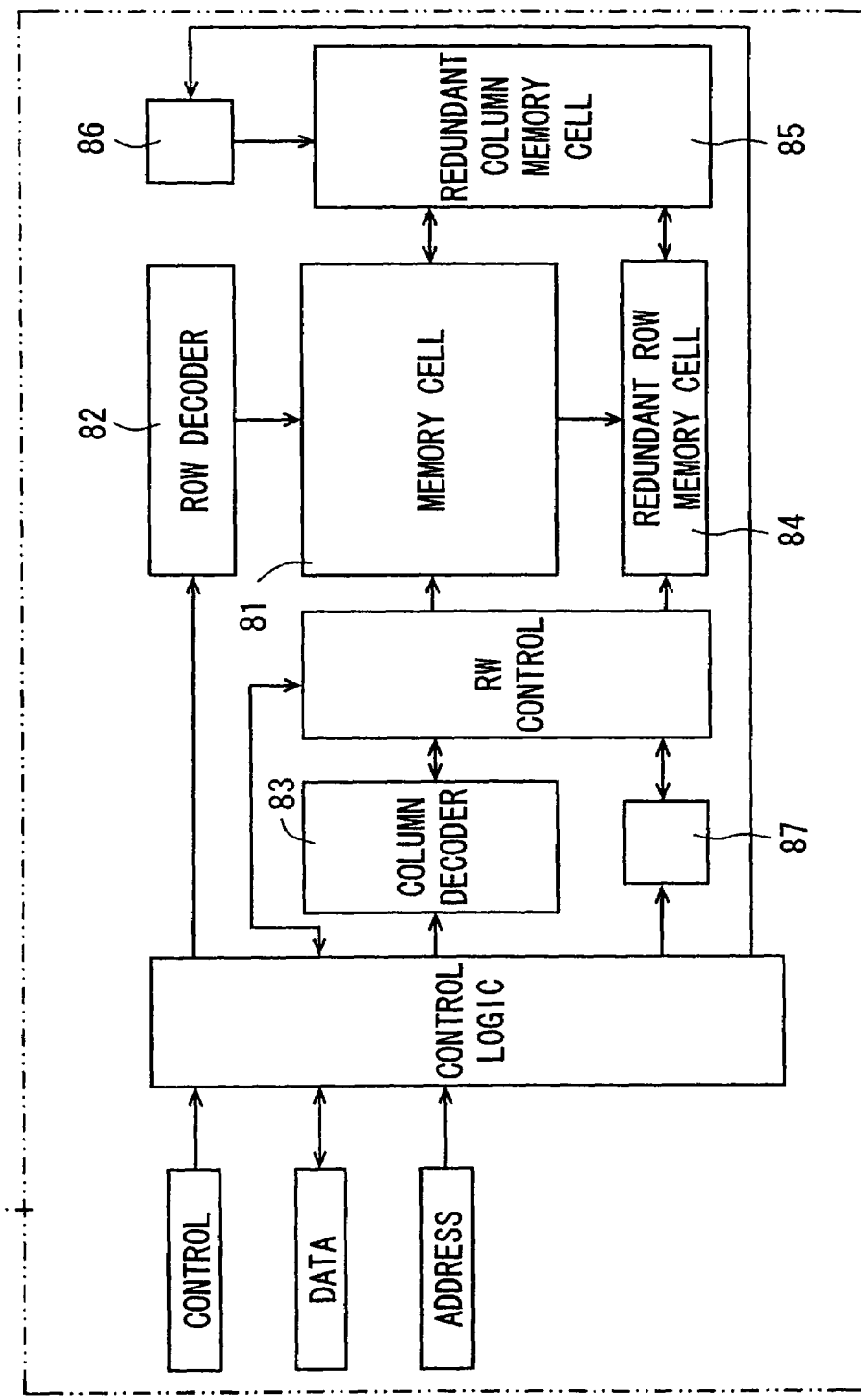
FIG. 21 is a block diagram showing a configuration of a memory chip applied with the related art.

FIGS. 20A and 20B are figures showing the timing to receive a signal by the memory chips different in the form of mounting. Time is shown on the axis of abscissa while voltage is on the axis of coordinate. FIG. 20A is a figure showing, a signal waveform to an input terminal of each of the memory chips when a signal is provided from the external for a memory device mounted with a plurality of memory chips in a planar arrangement. The timing of signal reception deviates, on between the memory chips, in an amount of a memory chip size relative to a driver output waveform as a signal from the external.

FIG. 20B is a figure showing the signal waveforms at input terminals of the memory chips when a signal is provided from the external to the memory device mounted with a plurality of memory chips stacked vertically or thickness thereof. Because the distance between the memory chips is an amount of the memory chip thickness and hence time difference in signal propagation is extremely small, all the memory chips are to receive the signal at the same timing. Namely, control is possible as if all the memory chips were one memory chip.

In this manner, the memory device 1 and 2 is composed of first memory chips not having redundant memories and a second memory chip configured with a logic for memory-controlling the memory device overall and a redundant memory, thus arranging signal lines to control the memory space of the memory device overall. The error bits existing on the first memory chips are all to be repaired by the redundant memory of the second memory chip. By allowing connection to an external circuit through the second memory chip, replacement is easy for the bits repaired with redundancy.

In the case the second memory chip makes a repair with redundancy, by including the logic for suppressing the operation of the first memory chip in the logic for memory-controlling the second memory chip, the first memory chips has not the necessity to mount thereon a logic for cutting off error bits. By doing so, the first memory chips are satisfactorily mounted with a simple logic for cutting off error bits without having redundant memories. Accordingly, the first memory chips can be realized minimal in chip size for the same capacity.

Furthermore, even in case control logics for controlling a plurality of memory chips are provided in a collective form on one memory chip, no signal-propagation time difference is caused by stacking a plurality of memory chips in a direction thickness thereof. It is possible to realize an operation similar to that with a control logic within the same memory chip even as viewed from another memory chip.

It is known that, where operating to take a plurality of averages over the events occurring with the same statistic disorder, those average values are equal from statistics wherein the standard deviation is given a value multiplied by a reciprocal of the square root of the number of time for taking the average. Namely, the greater the number of time for taking averages, the standard deviation decreases. This means that the distribution concentrates closer to the average value. Namely, it is expected that the distribution in the number of error bits concentrates closer in region to the average value.

Accordingly, in case the redundant memory mounted on another memory chip is made available in repairing an error bit by a redundant memory, the number of error bits can be handled in a manner concentrated to the average value similarly to the case of taking a plurality of averages, thus making it possible to optimize the storage capacity of the redundant memory.

In the case of stacking together a plurality of first memory chips not having redundant memories and a second memory chip having a redundant memory, the storage capacity of the redundant memory to be provided in the second memory chip is the summation over the error bits existing on the first memory chips and can be determined on an assumption concentrated to the averaged number.

Although explanations are so far made as a DRAM stacked memory, the invention is not limited in application to the DRAM but can be practiced in other storage schemes of memory devices and capacitances.

The invention may be embodied in other specific forms without departing from the spirit or essential characteristics thereof. The present embodiments are therefore to be considered in all respects as illustrative and not restrictive, the scope of the invention being indicated by the appended claims rather than by the foregoing description and all changes which come within the meaning and the range of equivalency of the claims are therefore intended to be embraced therein.

What is claimed is:

1. A memory device, comprising:

a plurality of memory mounting members each having at least one of storage means for storing data and redundant storage means for storing data to be stored to a defective point of the storage means, the plurality of memory mounting members being stacked in a direction of a thickness thereof, wherein, when a memory space of the defective point of the storage means is not allocated to redundant storage means of a memory mounting member having the defective point, the memory space of the defective points is allocated to redundant storage means of another of the memory mounting members, wherein the plurality of memory mounting members comprises a first memory mounting member having the storage means but not having the redundant storage means, and a second memory mounting member having the redundant storage means but not having the storage means, the second memory mounting member further has means for allocating the memory space of the defective point of the storage means included in the first memory mounting member to redundant storage means of the second memory mounting member, and controlling data write and read to and from the storage means of the first memory mounting member and the redundant storage means of the second memory mounting member, the plurality of memory mounting members each include one of the first memory mounting member and one of the second memory mounting member, wherein the first memory mounting member has chip selecting means for previously making a setting to select the first memory mounting member, and the means for controlling allocates memory sections divided correspondingly to the respective ones of the chip selecting means to the storage means of the first memory mounting member selected by the chip selecting means.

2. The memory device of claim 1, wherein the first memory mounting member has means for storing an identification number for identifying the first memory mounting member, and the means for controlling allocates a memory space specified based on the identification number to the storage means of the first memory mounting member storing a corresponding identification number in the means for storing an identification number.

3. A memory device, comprising:

a plurality of memory mounting members each having at least one of storage means for storing data and redundant storage means for storing data to be stored to a defective point of the storage means, the plurality of memory mounting members being stacked in a direction of a thickness thereof, wherein, when a memory space of the defective point of the storage means is not allocated to redundant storage means of a memory mounting member having the defective point, the memory space of the defective points is allocated to redundant storage means of another of the memory mounting members, wherein the plurality of memory mounting members comprises a first memory mounting member having the storage means but not having the redundant storage means, and a second memory mounting member having the redundant storage means but not having the storage means, the second memory mounting member further has means for allocating the memory space of the defective point of the storage means included in the first memory mounting member to redundant storage means of the second memory mounting member, and controlling data write and read to and from the storage means of the first memory mounting member and the redundant storage means of the second memory mounting member, the plurality of memory mounting members each include one of the first memory mounting member and one of the second memory mounting member, further comprising means for storing an address representative of a position of a defect in the storage means included in the first memory mounting member, and means for comparing between an address stored in the defect address storage means and an address where data is to be read and written, the means for controlling reading and writing data from and to a corresponding address of the redundant storage means of the second memory mounting member in place of the storage means of the first memory mounting member when the addresses compared by the means for comparing are in agreement.

* * * * *